US007141881B2

(12) United States Patent
Takayama et al.

(10) Patent No.: US 7,141,881 B2
(45) Date of Patent: Nov. 28, 2006

(54) SEMICONDUCTOR DEVICE HAVING A MULTILAYER INTERCONNECTION STRUCTURE, FABRICATION METHOD THEREOF, AND DESIGNING METHOD THEREOF

(75) Inventors: Toshio Takayama, Kawasaki (JP); Tetsuya Itou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 10/939,594

(22) Filed: Sep. 14, 2004

(65) Prior Publication Data

US 2005/0248034 A1 Nov. 10, 2005

(30) Foreign Application Priority Data

May 6, 2004 (JP) ............................ 2004-137684

(51) Int. Cl.
*H01L 23/40* (2006.01)

(52) U.S. Cl. ...................... 257/758; 257/774; 438/622; 438/629

(58) Field of Classification Search ................ 257/758, 257/774; 438/622, 629
See application file for complete search history.

(56) References Cited

U.S. PATENT DOCUMENTS

2003/0155642 A1* 8/2003 Davis et al. ................ 257/700

FOREIGN PATENT DOCUMENTS

| | | |
|---|---|---|
| JP | 11-233517 | 8/1999 |
| JP | 2002-299342 | 10/2002 |
| JP | 2003-142485 | 5/2003 |

OTHER PUBLICATIONS

Fuhan Liu; Sundaram, V.; Mekala, S.; White, G.; Sutter, D.A.; Tummala, R.R.; Fabrication of Ultra-Fine Line Circuits on PWB Substrates; IEEE Electronic Components and Technology Conference, 2002. Proceedings. 52nd; May 28-31, 2002 pp. 1425-1431.*

* cited by examiner

*Primary Examiner*—Nathan J. Flynn
(74) *Attorney, Agent, or Firm*—Westerman, Hattori, Daniels & Adrian, LLP.

(57) ABSTRACT

A semiconductor device includes an interconnection structure in which via-plug density is higher in an upper layer part than a lower layer part, wherein the peeling of the lower via-plugs at the time of formation of the upper-via-plugs is avoided by restricting the density of the upper s, defined for a unit area having a size of 50–100 μm for each edge, to be 60% or less.

8 Claims, 24 Drawing Sheets

| | | ERROR AREA [$um^2$] | | | | | | | | |
|---|---|---|---|---|---|---|---|---|---|---|
| | | PRODUCT A | PRODUCT B | PRODUCT C | PRODUCT D | PRODUCT E | PRODUCT F | PRODUCT G | PRODUCT H | PRODUCT I |
| NB | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 0 | 0 | 0 | 0 | 0 | 0 | 0 |
| | > 60% | 0 | 11,250 | 0 | 0 | 173,750 | 0 | 0 | 0 | 0 |
| | > 50% | 5,000 | 30,000 | 3,750 | 11,250 | 630,625 | 7,500 | 5,000 | 7,500 | 7,500 |
| NC | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 0 | 0 | 71,250 | 0 | 0 | 0 | 0 |
| | > 60% | 0 | 0 | 0 | 0 | 958,125 | 0 | 0 | 0 | 0 |
| | > 50% | 0 | 17,500 | 46,250 | 46,250 | 1,806,880 | 75,625 | 61,875 | 137,500 | 137,500 |
| ND | > 90% | 0 | 0 | 0 | 0 | 0 | 0 | 0 | 0 | 0 |
| | > 80% | 0 | 0 | 1,152,500 | 932,500 | 337,500 | 973,750 | 813,750 | 15,000 | 15,000 |
| | > 70% | 0 | 0 | 2,823,750 | 2,034,380 | 920,625 | 2,386,250 | 1,814,380 | 156,875 | 156,875 |
| | > 60% | 0 | 36,875 | 3,356,250 | 2,461,250 | 1,233,120 | 2,886,880 | 2,090,620 | 218,750 | 218,750 |
| | > 50% | 0 | 88,750 | 4,076,880 | 3,106,880 | 1,532,500 | 3,568,120 | 2,623,750 | 282,500 | 282,500 |

FIG.15

| | | ERROR AREA [$um^2$] | | | | | | | | |
|---|---|---|---|---|---|---|---|---|---|---|
| | | PRODUCT A | PRODUCT B | PRODUCT C | PRODUCT D | PRODUCT E | PRODUCT F | PRODUCT G | PRODUCT H | PRODUCT I |
| NB | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 0 | 0 | 0 | 0 | 0 | 0 | 0 |
| | > 60% | 0 | 0 | 0 | 0 | 0 | 0 | 0 | 0 | 0 |
| | > 50% | 0 | 0 | 0 | 0 | 307,500 | 0 | 0 | 0 | 0 |
| NC | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 0 | 0 | 0 | 0 | 0 | 0 | 0 |
| | > 60% | 0 | 0 | 0 | 0 | 430,000 | 0 | 0 | 0 | 0 |
| | > 50% | 0 | 0 | 0 | 0 | 1,527,500 | 0 | 0 | 90,000 | 90,000 |
| ND | > 90% | 0 | 0 | 0 | 0 | 0 | 0 | 0 | 0 | 0 |
| | > 80% | 0 | 0 | 200,000 | 95,000 | 75,000 | 200,000 | 130,000 | 0 | 0 |
| | > 70% | 0 | 0 | 1,980,000 | 1,075,000 | 532,500 | 1,595,000 | 1,195,000 | 162,500 | 162,500 |
| | > 60% | 0 | 0 | 3,377,500 | 2,190,000 | 1,005,000 | 2,852,500 | 2,247,500 | 192,500 | 192,500 |
| | > 50% | 0 | 0 | 4,245,000 | 3,422,500 | 1,537,500 | 3,750,000 | 2,865,000 | 210,000 | 210,000 |

FIG.18

| | | ERROR AREA [$um^2$] | | | | | | | | |
|---|---|---|---|---|---|---|---|---|---|---|
| | | PRODUCT A | PRODUCT B | PRODUCT C | PRODUCT D | PRODUCT E | PRODUCT F | PRODUCT G | PRODUCT H | PRODUCT I |
| NE | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 216,250 | 0 | 102,500 | 181,250 | 120,000 | 0 | 0 |
| | > 60% | 277,500 | 185,000 | 1,623,120 | 150,000 | 834,375 | 1,967,500 | 1,531,250 | 1,498,750 | 1,498,750 |
| | > 50% | 3,065,620 | 2,621,880 | 4,510,620 | 1,957,500 | 4,224,380 | 5,730,620 | 8,111,880 | 13,190,600 | 13,186,900 |
| NF | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 0 | 0 | 0 | 0 | 0 | 0 | 0 |
| | > 60% | 0 | 0 | 25,000 | 0 | 12,500 | 0 | 0 | 0 | 0 |
| | > 50% | 0 | 0 | 163,750 | 258,750 | 384,375 | 138,750 | 122,500 | 5,000 | 11,250 |
| NG | > 90% | 0 | 0 | 0 | 0 | 0 | 0 | 0 | 0 | 0 |
| | > 80% | 0 | 0 | 0 | 0 | 0 | 0 | 0 | 0 | 0 |
| | > 70% | 0 | 0 | 0 | 0 | 3,750 | 0 | 0 | 0 | 0 |
| | > 60% | 0 | 0 | 30,000 | 0 | 76,250 | 0 | 0 | 0 | 8,750 |
| | > 50% | 0 | 0 | 198,125 | 148,125 | 587,500 | 138,750 | 122,500 | 60,000 | 183,125 |

SEMICONDUCTOR DEVICE HAVING A MULTILAYER INTERCONNECTION STRUCTURE, FABRICATION METHOD THEREOF, AND DESIGNING METHOD THEREOF

CROSS-REFERENCE TO RELATED APPLICATION

The present application is based on Japanese priority application No.2004-137684 filed on May 6, 2004, the entire contents of which are hereby incorporated by reference.

BACKGROUND OF THE INVENTION

The present invention generally relates to semiconductor devices and more particularly to a fabrication process of a semiconductor device that uses a damascene process and a semiconductor device fabricated according to such a fabrication process.

Conventionally, improvement of operational speed has been achieved in semiconductor devices with device miniaturization achieved according to the scaling law.

On the other hand, recent high-density semiconductor integrated circuits generally use a multilayer interconnection structure for interconnecting various semiconductor elements therein. In such a multilayer interconnection, there arises a problem of signal delay caused by the stray capacitance between interconnection patterns when the semiconductor device is miniaturized excessively and the interconnection patterns in the multilayer interconnection structure approach with each other.

Thus, investigations are being made conventionally for eliminating the problem of signal delay in the multilayer interconnection structure by using a low dielectric film (so-called low-K film) such a an organic insulation film of hydrocarbon family or fluorocarbon family, in place of the $SiO_2$ insulation film used conventionally. It should be noted that such organic insulation films generally has the dielectric constant of 2.3–2.6, while this value is lower than that of the conventional $SiO_2$ interlayer insulation film by 40–50%. In combination therewith, use of low resistance copper (Cu) patterns is studied for the interconnection patterns in place of conventional Al patterns.

Generally, a low-dielectric film is characterized by its low density, and because of this, there remain problems such as adherence to the interconnection pattern or resistance against humidity. Because of this, it is generally practiced to use a low-K dielectric film and a Cu interconnection pattern to the lower part of the multilayer interconnection structure where the problem of signal delay appears conspicuously while continuously using the conventional $SiO_2$ insulation film characterized by excellent adherence in the upper part of the multilayer interconnection structure where the interconnection patterns are formed with relatively sparse interval.

SUMMARY OF THE INVENTION

FIG. 1 shows the construction of a conventional semiconductor device 10 having a typical multilayer interconnection structure.

Referring to FIG. 1, the semiconductor device 10 is formed on a device region 11A defined in a Si substrate 11 by a device isolation structure 11B and includes a gate electrode 13 formed on the Si substrate 11 via a gate insulation film 12, and a pair of diffusion regions 11*a* and 11*b* are formed in the device region 11A at both lateral sides of the gate electrode 13.

The gate electrode 13 has its sidewall surfaces covered with side wall insulation films 13*a* and 13*b*, and an interlayer insulation film 14 of $SiO_2$ or SiON is formed on the Si substrate 11 so as to cover the gate electrode 13 and the sidewall insulation films 13*a* and 13*b*.

On the interlayer insulation film 14, there is formed an organic low-K insulation film 15 typically of the material marketed from the Dow Chemical Company with the trade mark SiLK, and Cu patterns 15A and 15B are formed in the foregoing interlayer insulation film 15. It should be noted that the Cu interconnection patterns 15A and 15B are connected respectively to the foregoing diffusion regions 11*a* and 11*b* eclectically via contact plugs 14P and 14Q that are formed in the interlayer insulation film 14 in correspondence to the contact plugs 14P and 14Q respectively.

The Cu interconnection patterns 15A and 15B are covered by another low-K organic interlayer insulation film 16 formed on the interlayer insulation film 15, and a further low-K dielectric organic interlayer insulation film 17 is formed on the interlayer insulation film 16.

In the illustrated example, Cu interconnection patterns 16A–16C are embedded in the interlayer insulation film 16, and Cu interconnection patterns 17A and 17B are embedded in the interlayer insulation film 17. Further, the interconnection patterns 16A and 16C are connected to the interconnection patterns 15A and 15B respectively by way of via-plugs 16P and 16Q, while the interconnection patterns 17A and 17B are connected to the interconnection patterns 16A and 16C respectively by way of via-plugs 17P and 17Q.

In the illustrated example, SiOC interlayer insulation films 18, 19 and 20 are laminated consecutively on the interlayer insulation film 17, and an interconnection pattern 18A of Cu or Al is embedded in the interlayer insulation film 18. Further, an interconnection pattern 19A of Cu or Al is embedded in the interlayer insulation film 19, and an interconnection pattern 20A of Cu or Al is embedded in the interlayer insulation film 20.

The interconnection patterns 18A, 19A and 20A are electrically connected with each other by way of via-plugs not illustrated, while the interconnection pattern is 18A connected to any of the interconnection patterns 17A and 17B by way of a via-plug not illustrated.

Further, it should be noted that a passivation film 10P of SiN or the like is formed on the interlayer insulation film 20 so as to cover the interconnection pattern 20A, wherein it should be noted that the interlayer insulation films 15–20 and the interconnection patterns 15A, 15B, 16A–16C, and 17A–20A form a multilayer interconnection structure 10A together with the via-plugs 14P, 14Q, 16P and 16Q.

Because of the difficulty of dry etching of Cu, it is generally practiced to form such a multilayer interconnection structure by a so-called damascene process or dual damascene process in which interconnection grooves or via-holes are formed in the interlayer insulation film at first, followed by filling the interconnection grooves or the contact holes by a conductor film such as Cu, and removing the excessive conductor film remaining on the surface of the interlayer insulation film by a chemical mechanical polishing (CMP) process.

While having a general construction similar to the one shown in FIG. 1 for the semiconductor device 10, the semiconductor devices of these days tend to include wide variety of interconnection patterns in the multilayer interconnection structure 10A due to the increase of integration density and diversifying of the device functions. Thus, there can appear a situation in which the lower via-plugs 16P and 16Q may overlap with the via-plugs 17P and 17Q of the next layer when viewed perpendicularly to the substrate.

FIGS. 2A–2C show an example of such an interconnection structure 200, wherein FIG. 2A shows the interconnection structure 200 in a cross-sectional diagram, while FIG. 2B shows the structure of FIG. 2A in a plan view. Further, FIG. 2C shows a part of the structure of FIG. 2A corresponding to the second layer interconnection pattern in a plan view.

Referring to FIG. 2A, the interconnection structure 200 is formed by a dual damascene process and includes an etching stopper film 22 of SiN, SiC or SiOC formed on the lowermost insulation layer 21. Further, a low-K dielectric interlayer insulation film 23 of an organic insulation film is formed thereon.

On the interlayer insulation film 23, there is formed an etching stopper film 24 similar to the etching stopper film 22, and an interlayer insulation film 25 similar to the interlayer insulation film 23 is formed on the etching stopper film 24. On the interlayer insulation film 25, there is formed an etching stopper film 26 similar to the etching stopper film 24, and an interlayer insulation film 27 similar to the interlayer insulation film 25 is formed on the etching stopper film 26. On the interlayer insulation film 27, there is formed an etching stopper film 28 similar to the etching stopper film 26, and an interlayer insulation film 29 similar to the interlayer insulation film 27 is formed on the etching stopper film 28. On the interlayer insulation film 29, there is formed an etching stopper film 30 similar to the etching stopper film 28, and an interlayer insulation film 31 similar to the interlayer insulation film 28 is formed on the etching stopper film 30.

In the interlayer insulation film and the etching stopper film 30, there is formed an interconnection pattern 31A, wherein a plurality of via-plugs 29A extend from the interconnection pattern 31A through the interlayer insulation film 29 and the etching stopper film 28 located underneath the interconnection pattern 31A. The plurality of via-plugs 29A make a contact with the interconnection pattern 27A formed in the interlayer insulation film 27 and the etching stopper film 26.

Further, there extend a plurality of via-plugs 25A from the interconnection pattern 27A through the interlayer insulation film 25 and the etching stopper film 24 underneath the interconnection pattern 27A, wherein the via-plugs 25A make a contact with the interconnection patterns 23A and 23B formed in the interlayer insulation film 23 and the etching stopper film 22. In FIG. 2A, it should be noted that the illustration of the barrier metal film is omitted for the sake of simplicity of the drawing.

FIG. 2B shows the interconnection structure 200 of FIG. 2A in a plan view.

Referring to FIG. 2B, the interconnection patterns 31A, 27A, 23A and 23B form a wide conductor pattern, and it can be seen that the foregoing plural via-plugs 29A are formed in the form of a lattice pattern in the example of the interconnection pattern 31A.

Similarly, FIG. 2C shows the interconnection pattern 27A of FIG. 2A in a plan view, wherein it will be noted that the plural via-plugs 25A are formed in the form of a lattice pattern.

It should be noted that such an interconnection structure 200 is formed in the part of the semiconductor integrated circuit where there occurs a large current density such as a power line.

Meanwhile, such via-plugs 25A or 29A are formed periodically on all of or part of the lattice positions that are determined on the substrate by a design rule. Thereby, there can be a situation, in the case the via-plugs are to be formed with large density, that a via-plug 25A of the lower layer overlaps with a via-plug 29A of the upper layer when viewed in a plan view. FIG. 2A–2C show an example of such a situation.

The inventor of the present invention has discovered a problem, in the interconnection structure 200 in which the via-plugs 25A of the lower layer overlap with the via-plugs 29A of the upper layer in the plan view, in that there can occur peeling at the interface between the lowermost interconnection pattern 23A or 23B and the via-plug 25A making a contact therewith as circled in FIG. 3 by a broken line, particularly in the case the upper layer via-plugs 29A are formed with large density.

Such peeling occurs at the moment the via-holes for the via-plugs 29A are formed in the interlayer insulation film 29 and develops further upon filling of the via-holes by Cu.

In a first aspect of the present invention, there is provided an interconnection structure comprising:

a first interconnection layer comprising a first interlayer insulation film and a first interconnection pattern formed in said first interlayer insulation film so as to be exposed at a surface of said first interlayer insulation film, said first interlayer insulation film and said first interconnection pattern forming a common first planarized principal surface;

a second interconnection layer comprising a second interlayer insulation film formed on said first interlayer insulation film and a second interconnection pattern formed in said second interlayer insulation film so as to be exposed at a surface of said second interlayer insulation film, said second interlayer insulation film and said second interconnection pattern forming a common second planarized principal surface; and a third interconnection layer comprising a third interlayer insulation film formed on said second interlayer insulation film and a third interconnection pattern formed in said third interlayer insulation film so as to be exposed at a surface of said third interlayer insulation film, said third interlayer insulation film and said third interconnection pattern forming a common third planarized principal surface;

said second interconnection pattern being connected to said first interconnection pattern by a plurality of via-plugs extending through said second interlayer insulation film and forming a first via-plug group, said third interconnection pattern being connected to said second interconnection pattern by a plurality of via-plugs extending through said third interlayer insulation film and forming a second via-plug group, said first via-plug group including said plural via-plugs therein with a number such that a via-plug density defined as a ratio of a total area of said via-plugs forming said first via-plug group and included in a unit area to a total area of said via-plugs forming said first via-plug group and disposed in said unit area with a maximum possible number according a design rule, takes a first density value, said second via-plug group including said plural via-plugs therein with a number such that a via-plug density defined as a ratio of a total area of said via-plugs forming said second via-plug group and included in a unit area to a total area of said via-plugs forming said second via-plug group and disposed in said unit area with a maximum possible number according a design rule, takes a second density value, said first density value being smaller than said second density value, said design rule being set such that said via-plugs are disposed with a minimum pitch of 0.4 μm in any of said first and second via plug groups, said second density value being 70% or less.

In another aspect of the present invention, there is provided a method of fabricating a semiconductor device having a multilayer interconnection structure, comprising the steps of:

forming, on a first insulation film having a first interconnection pattern, a second interlayer insulation film;

forming a second interconnection pattern in said second interlayer insulation film by a dual damascene process such that said second interconnection pattern makes a contact with said first interconnection pattern with a plurality of via-plugs forming a first via-plug group;

forming a third interlayer insulation film on said second interlayer insulation film; and forming a third interconnection pattern in said third interlayer insulation film by a dual damascene process such that said third interconnection pattern makes a contact with said second interconnection pattern with a plurality of via-plugs forming a second via-plug group;

wherein there is provided a step of controlling a density of said via-plugs forming said second via-plug group to be 70% or less in the event said via-plugs are formed with a minimum pitch of 0.4 μm in said first and second via-plug groups.

In a further aspect of the present invention, there is provided a designing method of a semiconductor device, said semiconductor device comprising:

a first interconnection layer comprising a first interlayer insulation film and a first interconnection pattern formed in said first interlayer insulation film so as to be exposed at a surface of said first interlayer insulation film, said first interlayer insulation film and said first interconnection pattern forming a common first planarized principal surface;

a second interconnection layer comprising a second interlayer insulation film formed on said first interlayer insulation film and a second interconnection pattern formed in said second interlayer insulation film so as to be exposed at a surface of said second interlayer insulation film, said second interlayer insulation film and said second interconnection pattern forming a common second planarized principal surface; and a third interconnection layer comprising a third interlayer insulation film formed on said second interlayer insulation film and a third interconnection pattern formed in said third interlayer insulation film so as to be exposed at a surface of said third interlayer insulation film, said third interlayer insulation film and said third interconnection pattern forming a common third planarized principal surface;

said second interconnection pattern being connected to said first interconnection pattern by a plurality of via-plugs extending through said second interlayer insulation film and forming a first via-plug group, said third interconnection pattern being connected to said second interconnection pattern by a plurality of via-plugs extending through said third interlayer insulation film and forming a second via-plug group, said first via-plug group including said plural via-plugs therein with a number such that a via-plug density defined as a ratio of a total area of said via-plugs forming said first via-plug group and included in a unit area to a total area of said via-plugs forming said first via-plug group and disposed in said unit area with a maximum possible number according a design rule, takes a first density value, said second via-plug group including said plural via-plugs therein with a number such that a via-plug density defined as a ratio of a total area of said via-plugs forming said second via-plug group and included in a unit area to a total area of said via-plugs forming said second via-plug group and disposed in said unit area with a maximum possible number according a design rule, takes a second density value smaller than said second density value, said design rule being set such that said via-plugs are disposed with a minimum pitch of 0.4 μm in any of said first and second via-plug groups, said second density value being restricted to 70% or less.

According to the present invention, it becomes possible to suppress the problem of peeling occurring between the first interconnection layer and the via-plugs of the first via-plug group by restricting the second density value to be 70% or less.

Other objects and further features of the present invention will become apparent from the following detailed description when read in conjunction with the attached drawings.

BRIEF DESCRIPTION OF THE DRAWINGS

FIG. 14 is a further diagram explaining the principle of the first embodiment of the present invention;

FIG. 15 is a further diagram explaining the principle of the first embodiment of the present invention;

FIG. 18 is a diagram showing the principle of the second embodiment of the present invention;

DETAILED DESCRIPTION OF THE INVENTION

First Embodiment

Figure 3:
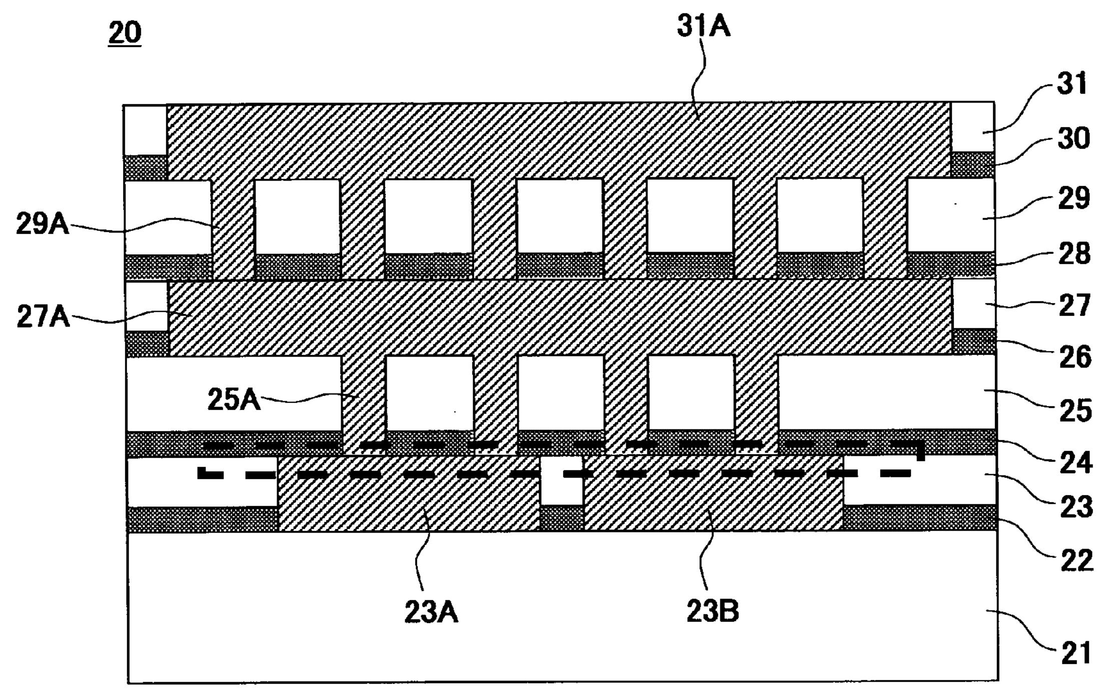
FIG. 3 is another diagram explaining the problems addressed by the present invention.

In the experiments that constitutes a first embodiment of the present invention, the inventor of the present invention has investigated the occurrence of the foregoing problem of peeling with regard to an interconnection structure 100 to be explained later with reference to FIGS. 7 and 8, by forming the interconnection structure 100 while changing a via-plug density NC of a first via-group corresponding to via-plugs 45A and a via-plug density ND of a second via-group corresponding to via-plugs 49A variously. It should be noted that the interconnection structure 100 corresponds to the interconnection structure 20 of FIG. 3.

Hereinafter, the fabrication process of the interconnection structure 100 will be explained with reference to FIGS. 4A–4M.

Figure 4A:
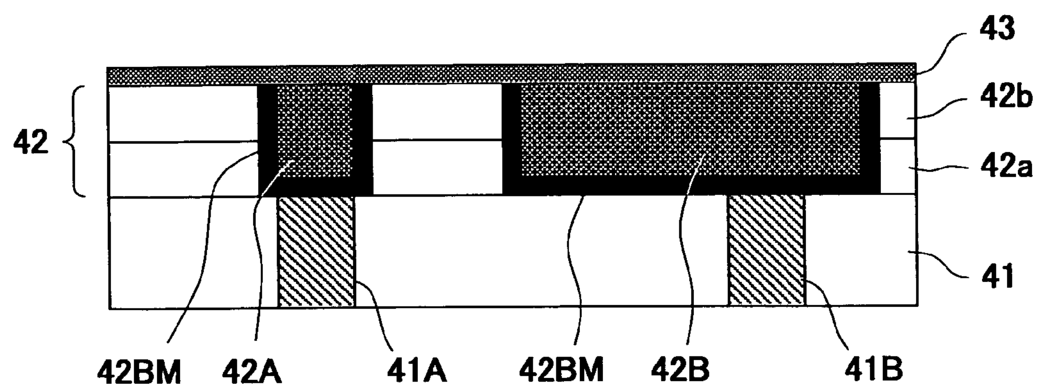
FIGS. 4A–4M are diagrams showing the fabrication process of a semiconductor device according to a first embodiment of the present invention.

Referring to FIG. 4A, there is formed an interlayer insulation film 42 on an underlying insulation film 41 of $SiO_2$ or SiON formed with W plugs 41A and 41B, such that the interlayer insulation film 42 includes a lamination of an interlayer insulation film 42*a* and a polishing stopper film 42*b*, wherein the interlayer insulation film 42*a* may be formed of an SOG film, or the like, while the polishing stopper film 42*b* may be formed of $SiO_2$, or the like. In the interlayer insulation film 42, there are formed Cu interconnection patterns 42A and 42B by a single damascene process in contact with the W plugs 41A and 41B together with a barrier metal film 42BM having a laminated structure in which a metal layer and a metal nitride layer are stacked. Further, the underlying insulation film 41 corresponds to the insulation film 11 of the semiconductor device 10 of FIG. 1 and is formed on a silicon substrate 11.

Figure 4B:
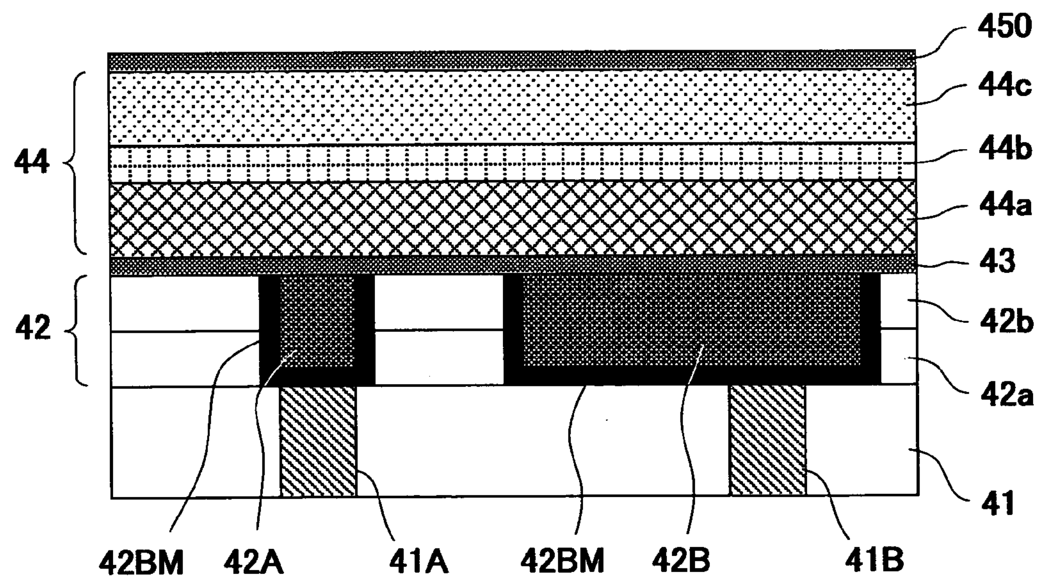

Further, there is formed an SiN film 43 in the step of FIG. 4A on the foregoing $SiO_2$ film 42 with a thickness of 70 nm, for example, and an interlayer insulation film 44 is formed on the SiN film 43 in the step of FIG. 4B, wherein it should be noted that the interlayer insulation film 44 is formed by a lamination of an $SiO_2$ interlayer insulation film 44*a*, an etching stopper film 44*b* and an interlayer insulation film 44*c* of $SiO_2$, or the like, with respective thicknesses of 280 nm, 150 nm and 250 nm. Further, an etching stopper film 450 of SiN, or the like, is formed on the interlayer insulation film 44*c* with a thickness of 100 nm.

Figure 4C:
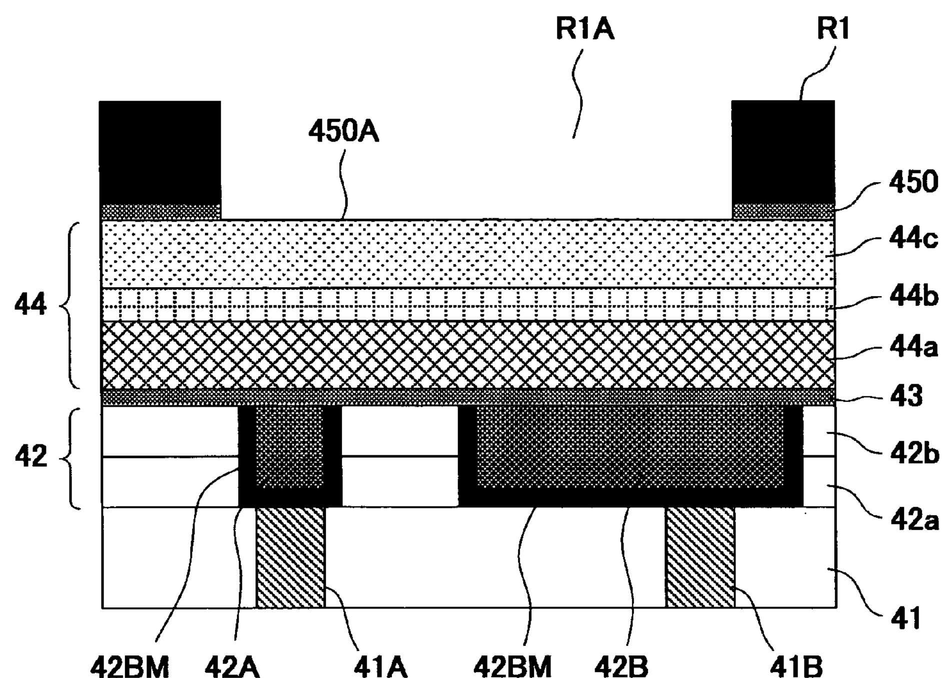

Next, in the step of FIG. 4C, a resist pattern R1 is formed on the SiN etching stopper film 45 such that the resist pattern R1 has a resist window R1A corresponding to the shape of the interconnection pattern to be formed in the interlayer insulation film 44. Further, the SiN film 45 is patterned while using the resist pattern R1 as a mask, and there is formed an opening 450A in the SiN film 450 in correspondence to the shape of the interconnection pattern to be formed.

Figure 4D:
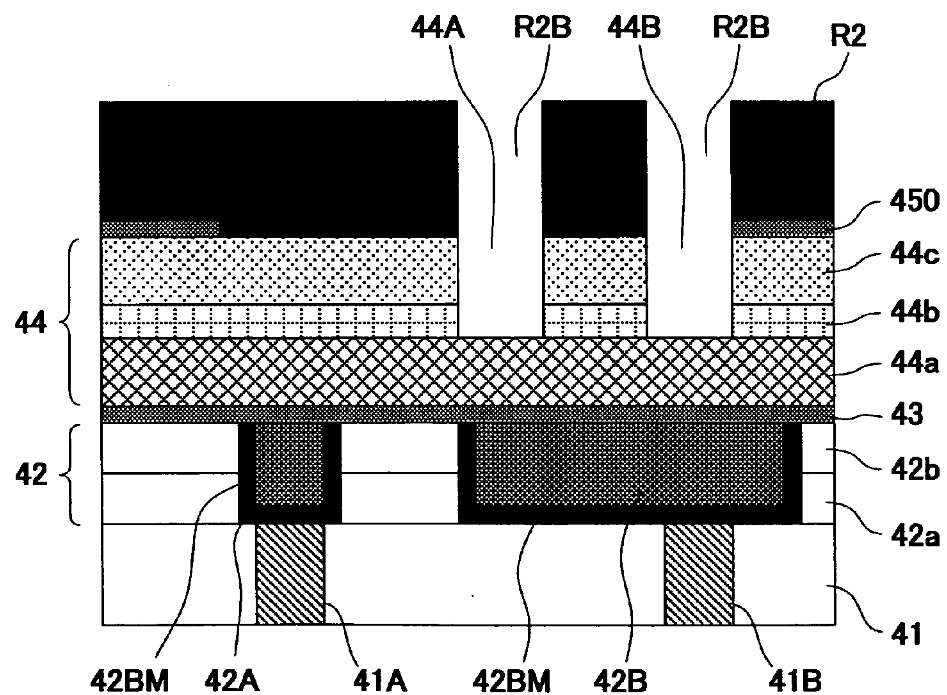

Next, in the step of FIG. 4D, the resist pattern R1 is removed, and a resist pattern R2 is formed on the SiN film 450 so as to cover the opening 450A, wherein the resist pattern R2 is formed with resist openings R2A and R2B corresponding to the shaper of the via-plugs to be formed in the interlayer insulation film 44. Further, a dry etching process is applied to the interlayer insulation film 44 while using the resist pattern R2 as a mask, and there are formed openings 44A and 44B such that the openings 44A and 44B penetrate through the $SiO_2$ film 44*c* and the SOG film 44*b* and expose the $SiO_2$ film 44*a*.

Figure 4E:
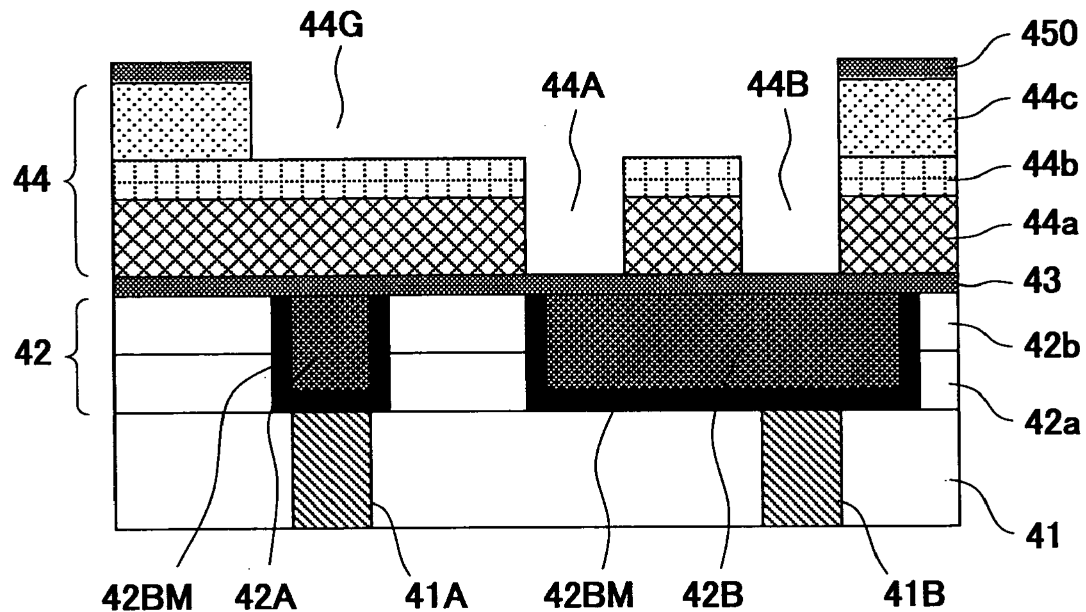

Next, in the step of FIG. 4E, the resist pattern R2 is removed and the interlayer insulation film 44*c* and 44*a* are subjected to a simultaneous dry etching process while using the SiN film 450 formed with the opening 450A and the SOG film 44*b* formed with the openings 44A and 44B as a hard mask. As a result, there is formed an interconnection groove 44G in the interlayer insulation film 44*c* with a shape corresponding to the opening 450A and hence the interconnection pattern to be formed. Further, the openings 44A and 44B are formed in the interlayer insulation film 44*a* such that the openings 44A and 44B expose the SiN film 43 at the bottom part thereof.

Figure 4F:
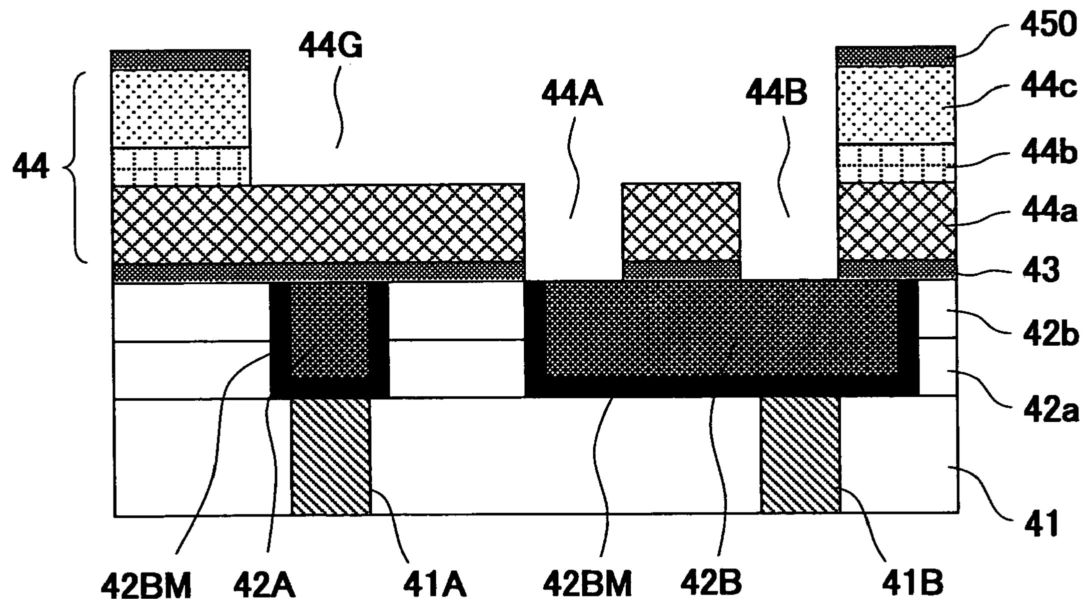

Further, in the step of FIG. 4F, a dry etching is applied to the structure of FIG. 4E for removing the SiN film, and the Cu interconnection pattern 42B is exposed at the bottom of the openings 44A and 44B. Thereby, the openings 44A and 44B form a via-hole.

In the step of FIG. 4F, the SOG film 44*b* is patterned further until the $SiO_2$ film 44*a* underneath is exposed while using the SiN film 450 remaining on the interlayer insulation film 44*c* as a hard mask, and the interconnection groove 44G is now formed in the interlayer insulation film 44*b*. It should be noted that the SiN film 450 remains on the interlayer insulation film 44*c* in the state of FIG. 4F because the SiN film 450 is formed with the thickness larger than the thickness of the SiN film 43.

Figure 4G:
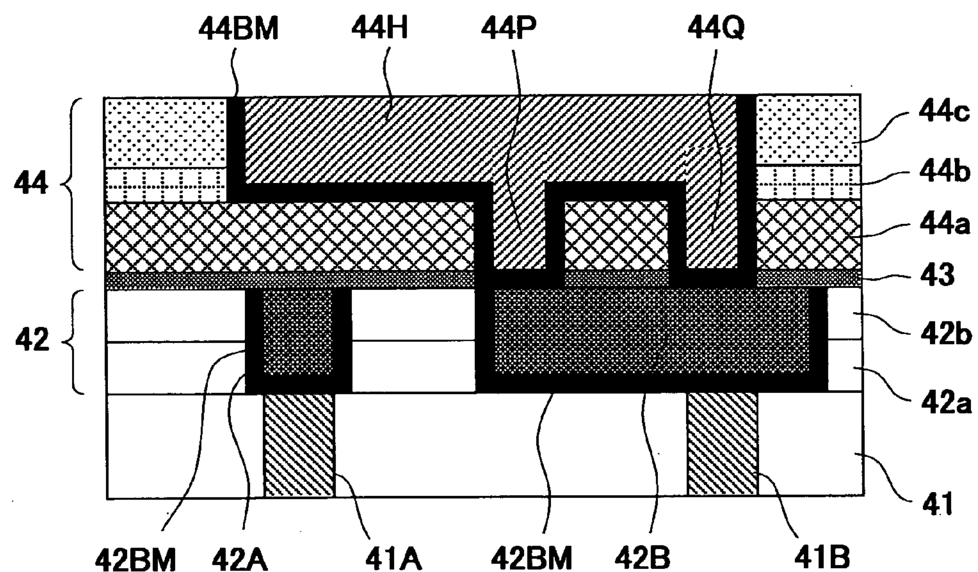

Next, in the step of FIG. 4G, the interconnection groove 44G and the via-holes 44A and 44B are filled with Cu via a barrier metal film 44BM, and the Cu film and the SiN film 450 remaining on the interlayer insulation film 44*c* is polished out by a CMP process. With this, a Cu interconnection pattern 44H is formed so as to fill the interconnection groove 44G.

In the Cu interconnection pattern 44H thus formed, there extend Cu plugs 44P and 44Q in correspondence to the via-holes 44A and 44B, and the Cu plugs 44P and 44P make a contact with the Cu interconnection pattern 42B via the foregoing barrier metal film 44BM.

Incidentally, the process of FIG. 4C is carried out such that the surface of the Cu interconnection pattern 42B exposed by the step of FIG. 4F is removed immediately before deposition of the barrier metal film 44BM with a thickness of 7.5 nm, by applying an RF sputtering process. With this, any contaminants such as oxygen or defects existing on the surface of the Cu interconnection pattern 42B are removed.

Figure 4H:
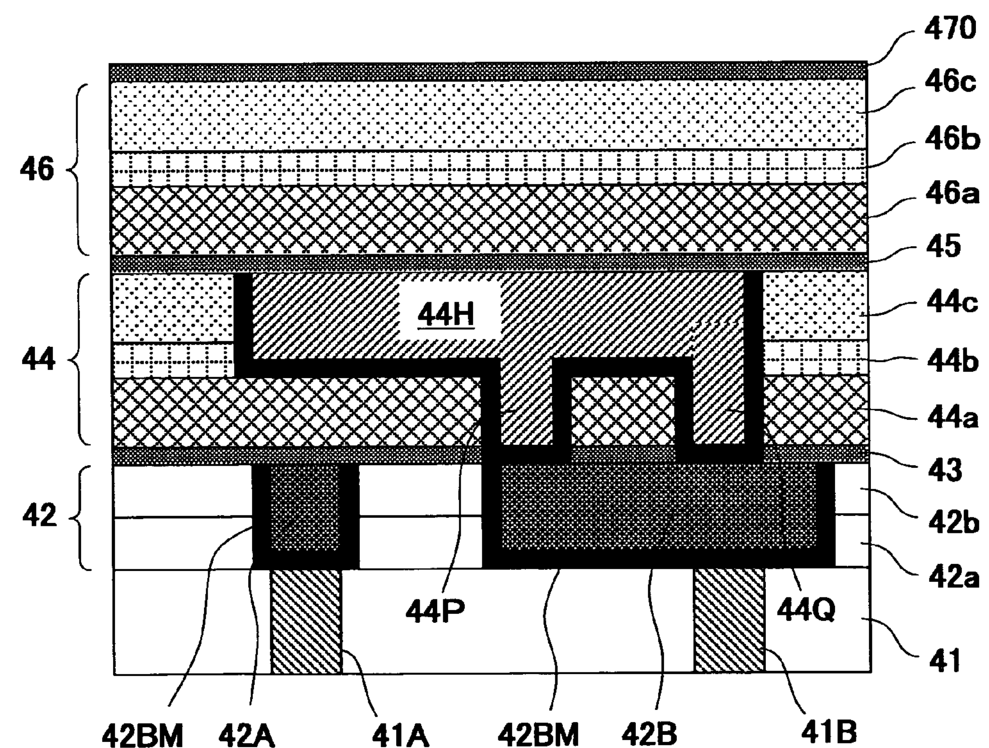

Next, in the step of FIG. 4H, an SiN film 45, an $SiO_2$ film 46*a*, an SOG film 46*b*, an $SiO_2$ film 46*c* and an SiN film 470 are deposited on interlayer insulation film 44*c* so as to cover the exposed Cu interconnection pattern 44H, with respective thicknesses of 70 nm, 280 nm, 150 nm, 250 nm and 100 nm, wherein the layers 46*a*–46*c* form an interlayer insulation film 46.

Figure 4I:
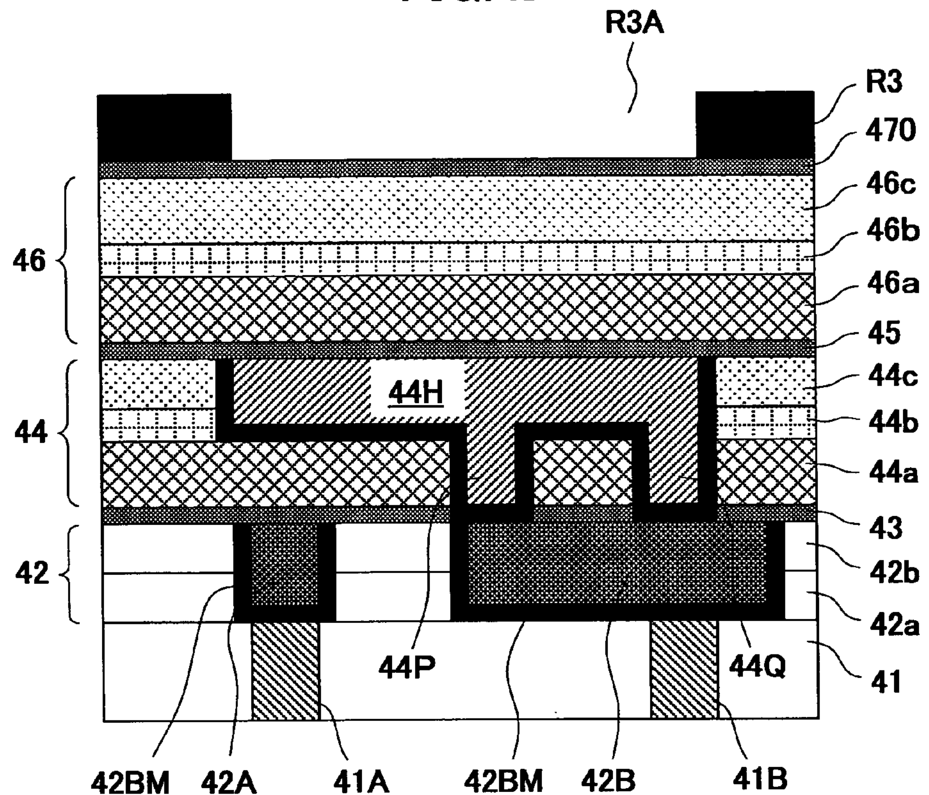
Figure 4J:
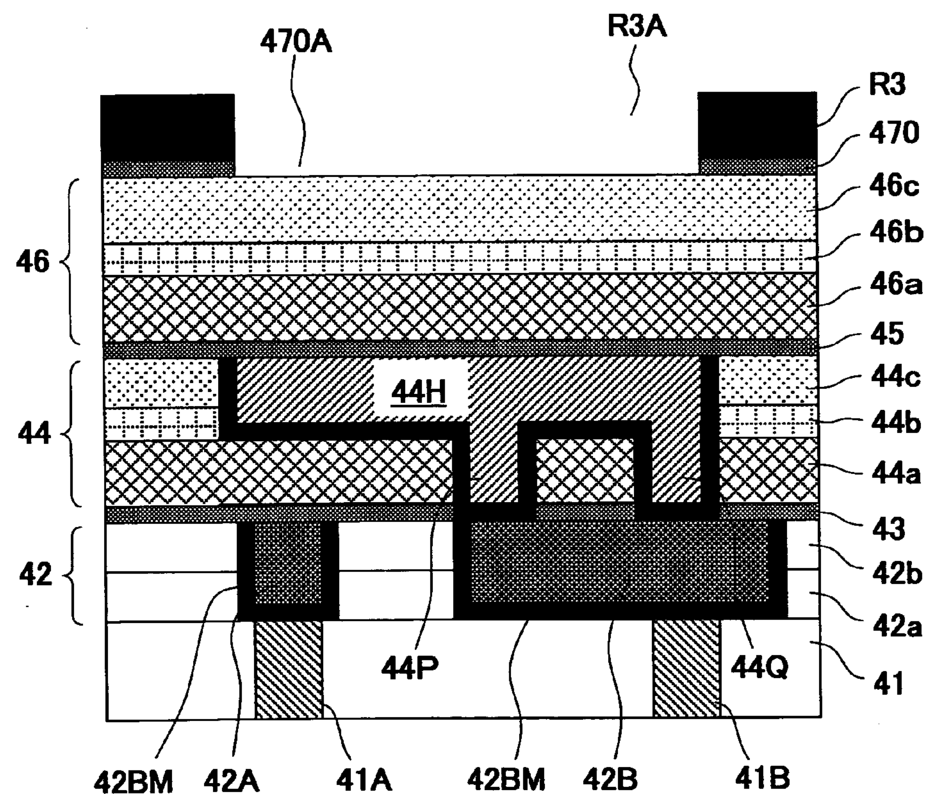

Next, in the step of FIG. 4I, a resist pattern R3 is formed on the foregoing SiN film 470 with a resist opening R3A such that the resist opening R3A has a shape corresponding to the shape of the interconnection pattern to be formed in the interlayer insulation film 46, and the SiN film 470 is patterned in the step of FIG. 4J while using the resist pattern R3 as a mask. Thereby, an opening 470A corresponding to the resist opening R3A is formed in the SiN film 470.

Figure 4K:
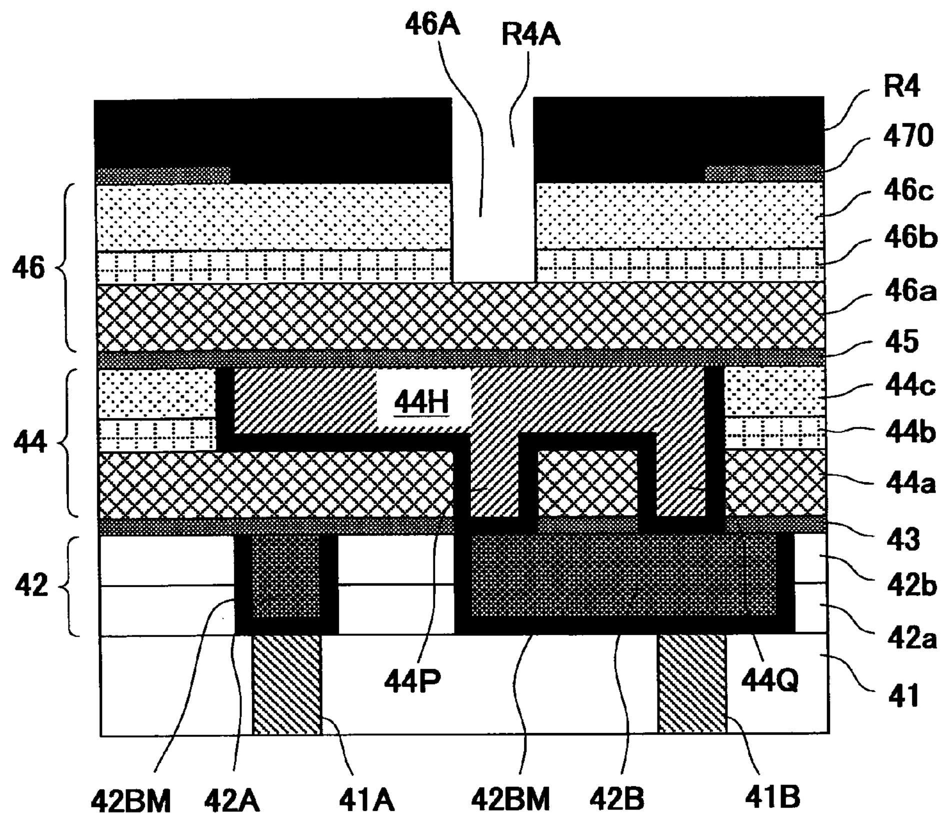

Next, in the step of FIG. 4K, the resist pattern R3 is removed and another resist pattern R4 is formed such that the resist pattern R4 has a resist opening 44A corresponding to the via-hole to be formed in the interlayer insulation film 46. Further, the $SiO_2$ film 45*c* and the SOG film 46*b* underneath the $SiO_2$ film 45*c* are patterned while using the resist pattern R4 as a mask, and an opening 46A is formed in the layers 46*c* and 46*b* in correspondence to the resist opening R4A.

Figure 4L:
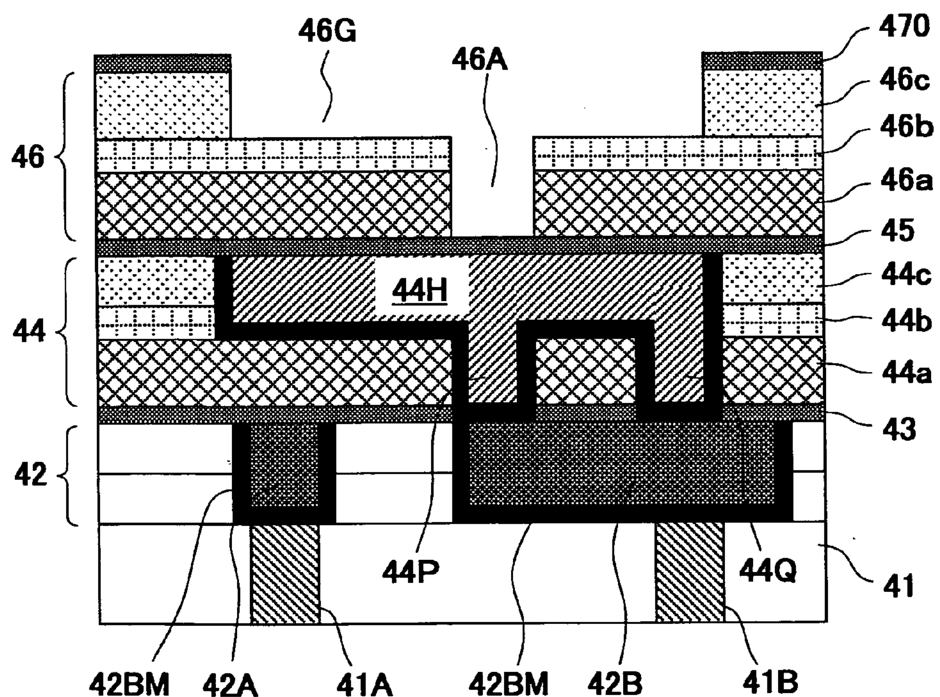

Further, in the step of FIG. 4L, the resist pattern R4 is removed, and the interlayer insulation films 46*c* and 46*a* are subjected to a simultaneous dry etching process while using the SiN film 470 as a mask, such that the SOG film 46*b* and the SiN film 45 are exposed. Thereby, there is formed an opening 46G in the interlayer insulation film 46 with a shape corresponding to the shape of the opening 470A in the SiN film 470. Further, the opening 46A extends through the interlayer insulation film 46*a*.

Figure 4M:
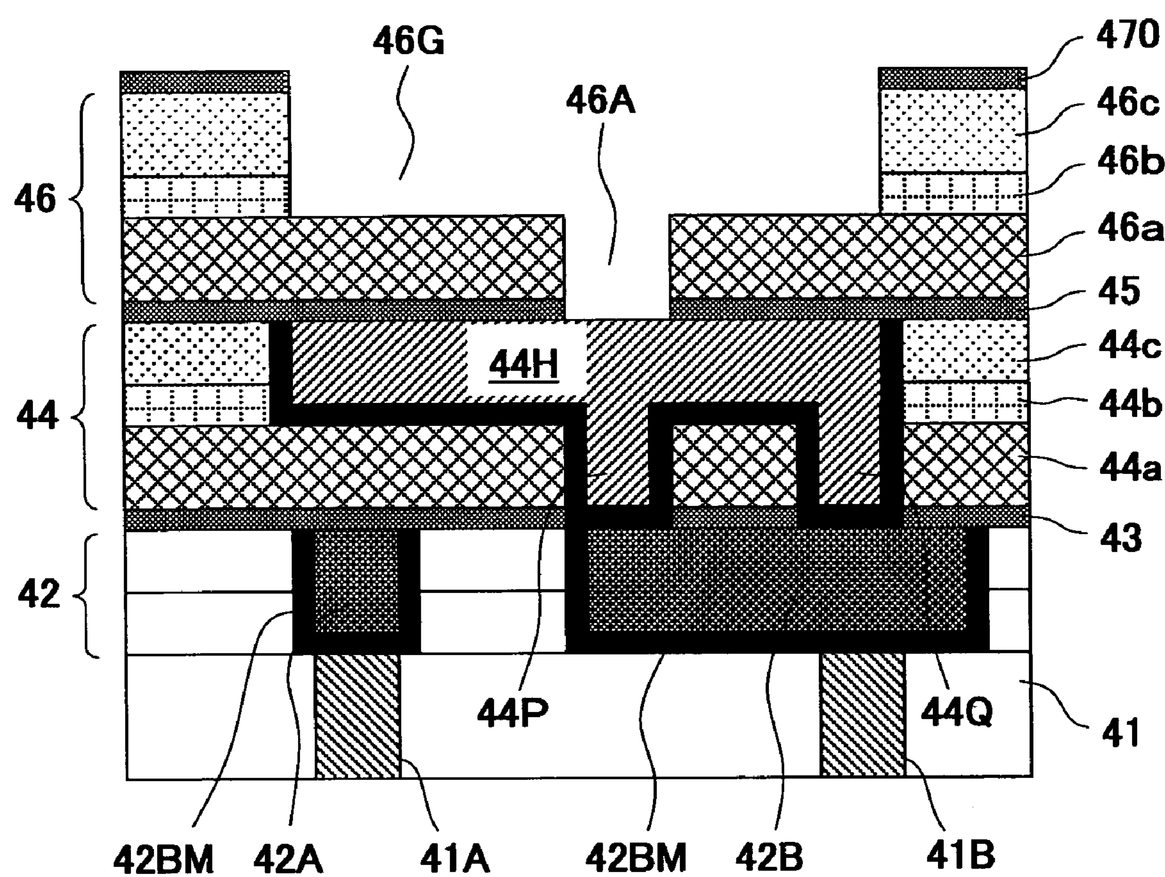

Next, in the step of FIG. 4M, the SiN film 45 exposed at the bottom of the opening 46A is removed by a dry etching process, and with this, there is formed a via-hole 46A in the interlayer insulation film 46*a* such that the via-hole 46A exposes the underlying Cu pattern 44H.

Further, in the step of FIG. 4M, the SOG film 46 is patterned while using the SiN film 470 remaining on the interlayer insulation film 46*c* as a mask, and with this, there is formed an interconnection groove 46G in the interlayer insulation film 46*b*. Because the SiN film 470 is formed with a thickness larger than the thickness of the SiN film 45, it should be noted that the SiN film 470 remains on the interlayer insulation film 46*c* in the state of FIG. 4M.

Further, while not illustrated, the interconnection groove 46G and the via-hole 46A are filled with a Cu layer via a barrier metal film, and the excessive Cu layer and the SiN film 470 on the interlayer insulation film 46*c* are polished out by a CMP process.

Figure 5:
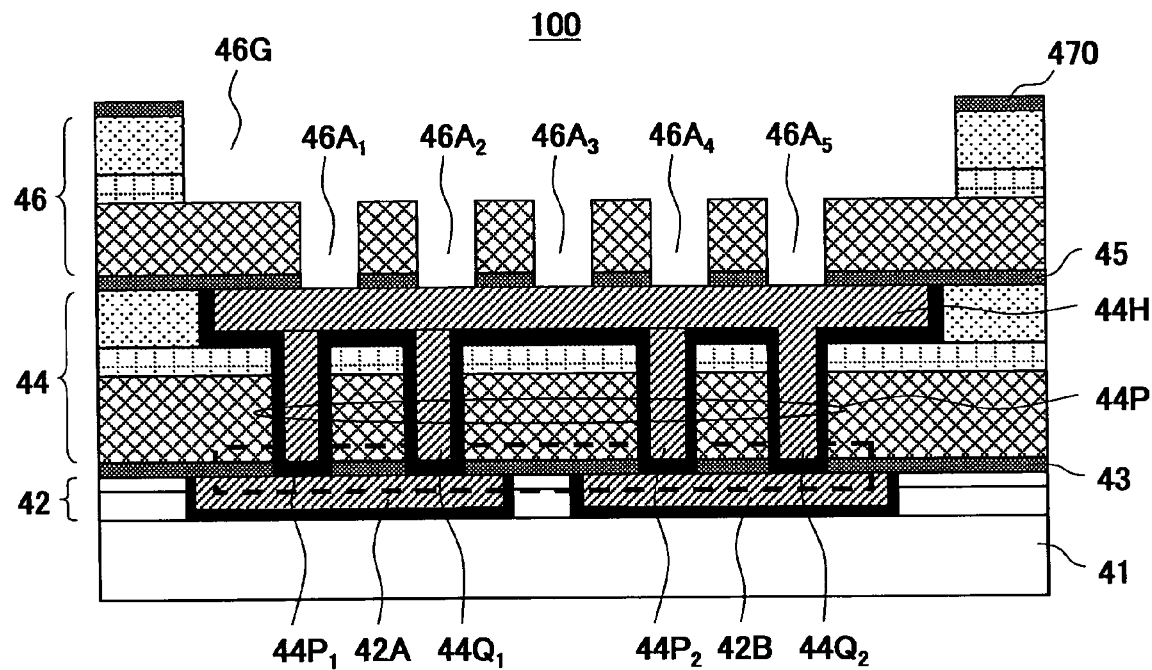
FIG. 5 is a diagram showing the construction of a semiconductor device according to a first embodiment of the present invention.
Figure 6:
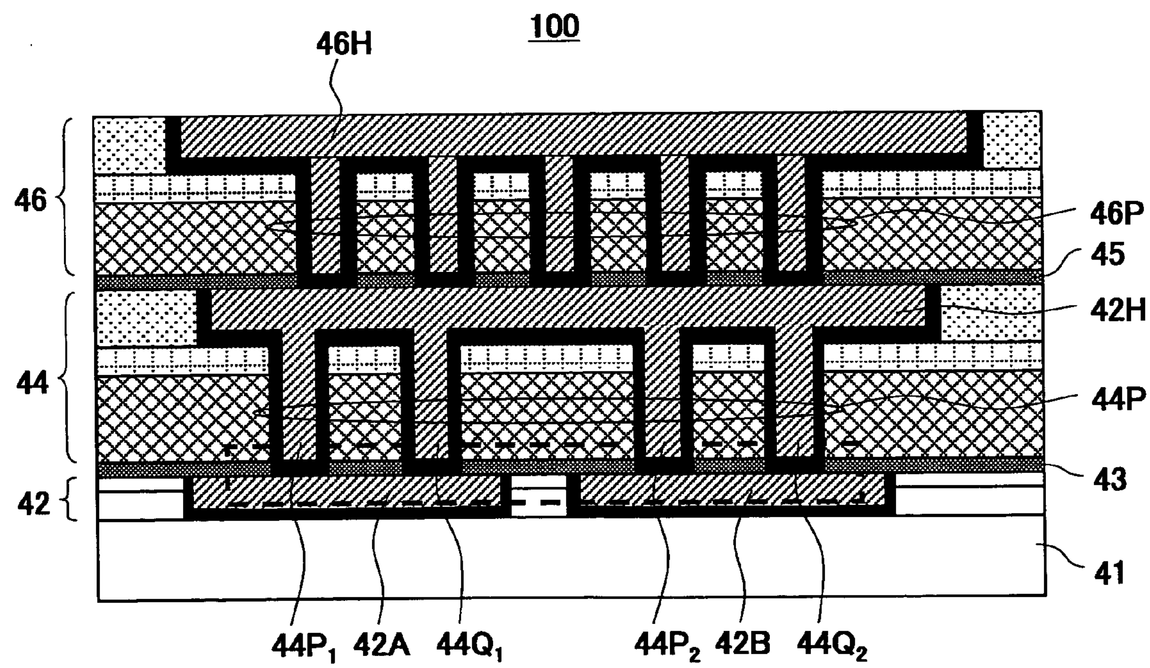
FIG. 6 is another diagram showing the construction of the semiconductor device of the first embodiment of the present invention.

FIGS. 5 and 6 show an example of the interconnection structure 100 of the present embodiment formed by such a dual damascene process, wherein it should be noted that those parts of FIGS. 5 and 6 corresponding to the parts explained previously are designated by the same reference numerals and the description thereof will be omitted.

Referring to FIG. 5, there extend Cu via-plugs $\mathbf{44}P_1$ and $\mathbf{44}Q_1$ from the Cu interconnection pattern 44H formed in the interlayer insulation film 44 to the Cu interconnection pattern 42A in correspondence to the via-plugs 44P and 44Q, and Cu via-plugs $\mathbf{44}P_2$ and $\mathbf{44}Q_2$ extend to the Cu interconnection pattern 42B. Hereinafter, the Cu via-plugs $\mathbf{44}P_1$, $\mathbf{44}Q_1$, $\mathbf{44}P_2$, $\mathbf{44}Q_2$ are collectively designated as 44P.

It should be noted that the sate of FIG. 5 corresponds to the state of FIG. 4M and there are formed via-holes $\mathbf{46}A_1$–$\mathbf{46}A_5$ that expose the Cu interconnection pattern 44H in correspondence the via-holes 46A.

As noted before, the inventor of the present invention has discovered the problem that there can occur a peeling at the part between the Cu interconnection pattern 42A or 42B and the Cu via-plugs $\mathbf{44}P_1$ and $\mathbf{44}Q_1$ or $\mathbf{44}P_2$ and $\mathbf{44}Q_2$ contacting therewith in the state of FIG. 5, in other words, in the state in which the via-holes $\mathbf{46}A_1$–$\mathbf{46}A_5$ are formed in the interlayer insulation film 46, as represented by a broken line in the drawing. This problem of peeling becomes even larger when the interconnection groove 46G and the via-holes $\mathbf{44}P_1$, $\mathbf{44}Q_1$, $\mathbf{44}P_2$ and $\mathbf{44}Q_2$ are filled with Cu and the Cu plugs 46P are formed.

While the cause of this problem of peeling is not well understood at the present juncture, the inventor of the present invention has conducted an investigation in search of the condition that causes such a peeling, by changing the density of the via-plugs 44P and 44Q.

Figure 7A:
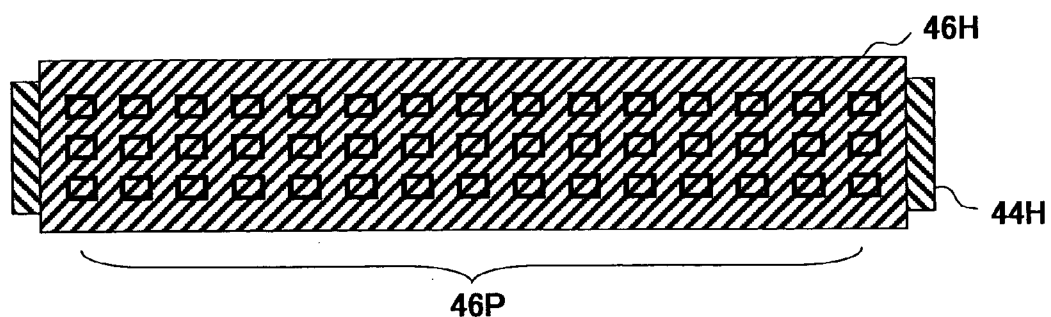
FIGS. 7A–7C are diagrams showing the array of via-plugs used in the experiment constituting the foundation of the present invention.
Figure 7B:
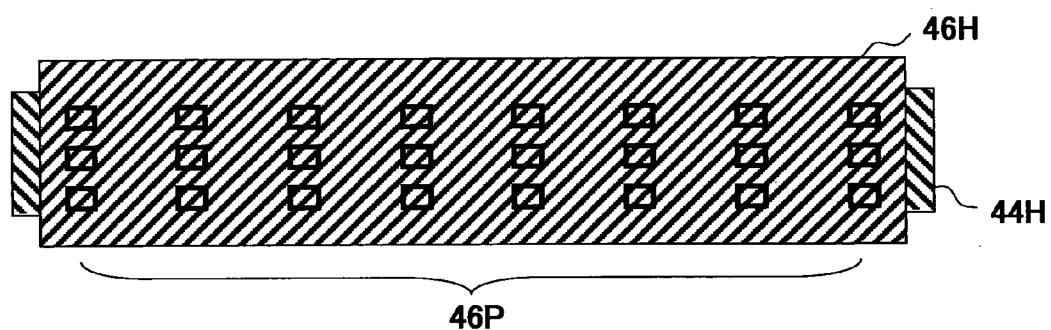
Figure 7C:
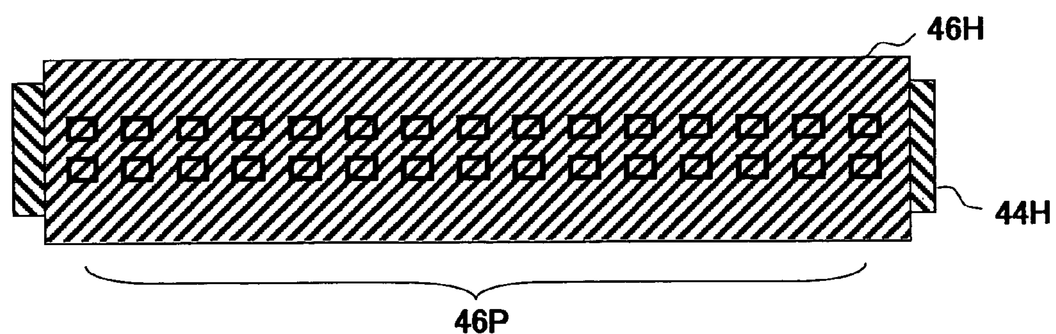
Figure 8A:
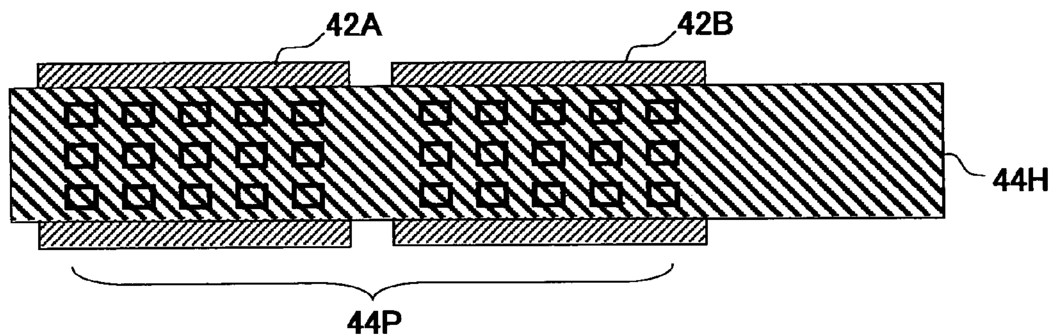
FIGS. 8A–8C are diagrams showing the array of via-plugs used in the experiment constituting the foundation of the present invention.
Figure 8B:
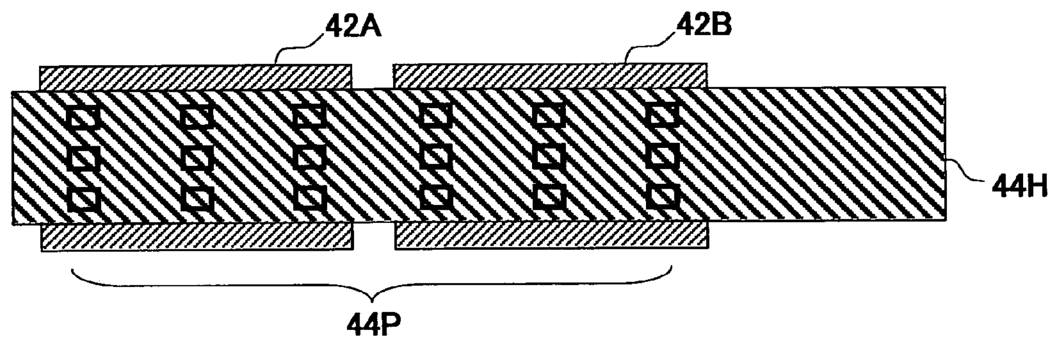
Figure 8C:
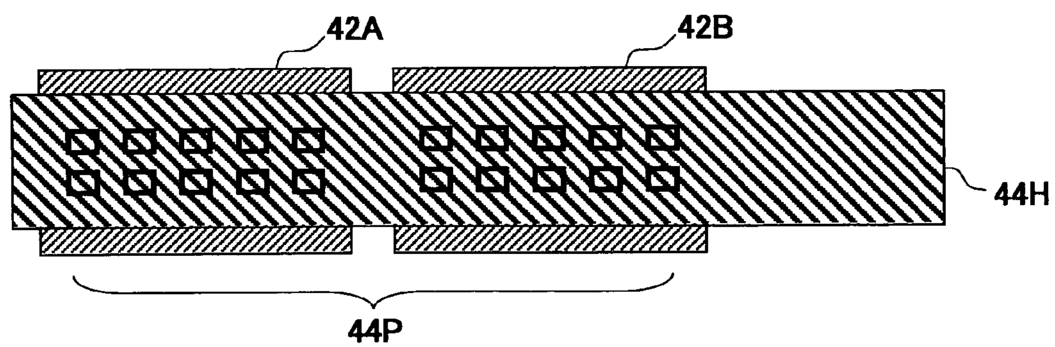

FIGS. 7A–7C show the pattern of the s46P used in such a search, while FIGS. 8A–8C show the pattern of the via-plugs 44P used in the foregoing search.

Referring to FIGS. 7A–7C and 8A–8C, each of the via-plugs 46P and 44P has a square cross-section having a length of 0.22 μm for each edge and the plugs 46P and 44P are formed with a design rule of 0.4 μm, in other words with the minimum pitch of 0.4 μm.

Here, it should be noted that FIG. 7A shows the case in which the density of the via-plugs 46P is set to 80%, while FIG. 7B shows the case in which the density of the same via-plugs 46P is set to 70%. Further, FIG. 7C shows the case in which the density of the via-plugs 46P is set to 53%. On the other hand, FIG. 8A shows the case in which the density of the via-plugs 44P is set to 50%, while FIG. 8B shows the case in which the density of the via-plugs 44P is set to 25%. Further, FIG. 8C shows the case in which the density of the via-plugs 44P is set to 33%.

In the foregoing search, it should be noted that the experiments have been conducted by combining the patterns of FIGS. 7A–7C and the patterns of FIGS. 8A–8C variously.

Figure 9:
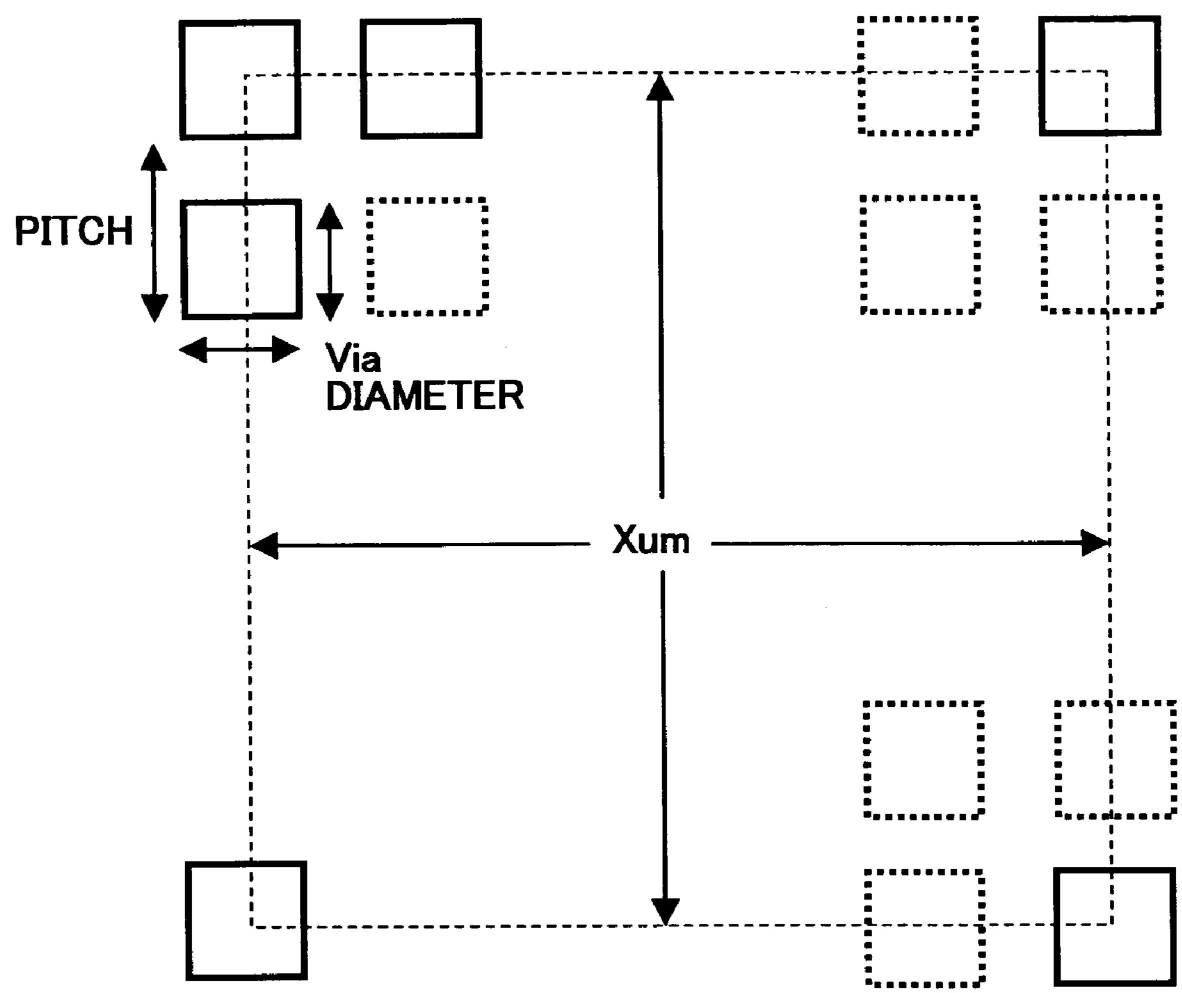
FIG. 9 is a diagram explaining the definition of the via-plug density as used in the present invention.

FIG. 9 is a diagram showing the definition of the via-plug density as used in the present invention.

Referring to FIG. 9, the via-plug density is defined for a region having a length of X [μm] for each edge and is given by Equation (1)

$$\text{density}=[\text{total area of actually existing s}]/\{(\text{via-diameter}\times\text{via-diameter})\times(X/\text{pitch})\times(X/\text{pitch})\}, \quad (1)$$

wherein Equation (1) defines the via-plug density as the total area of the via-plugs actually arrayed in the foregoing region divided by the total area of the via-plugs disposed in the foregoing area with the maximum possible number according to the design rule.

Figure 10:
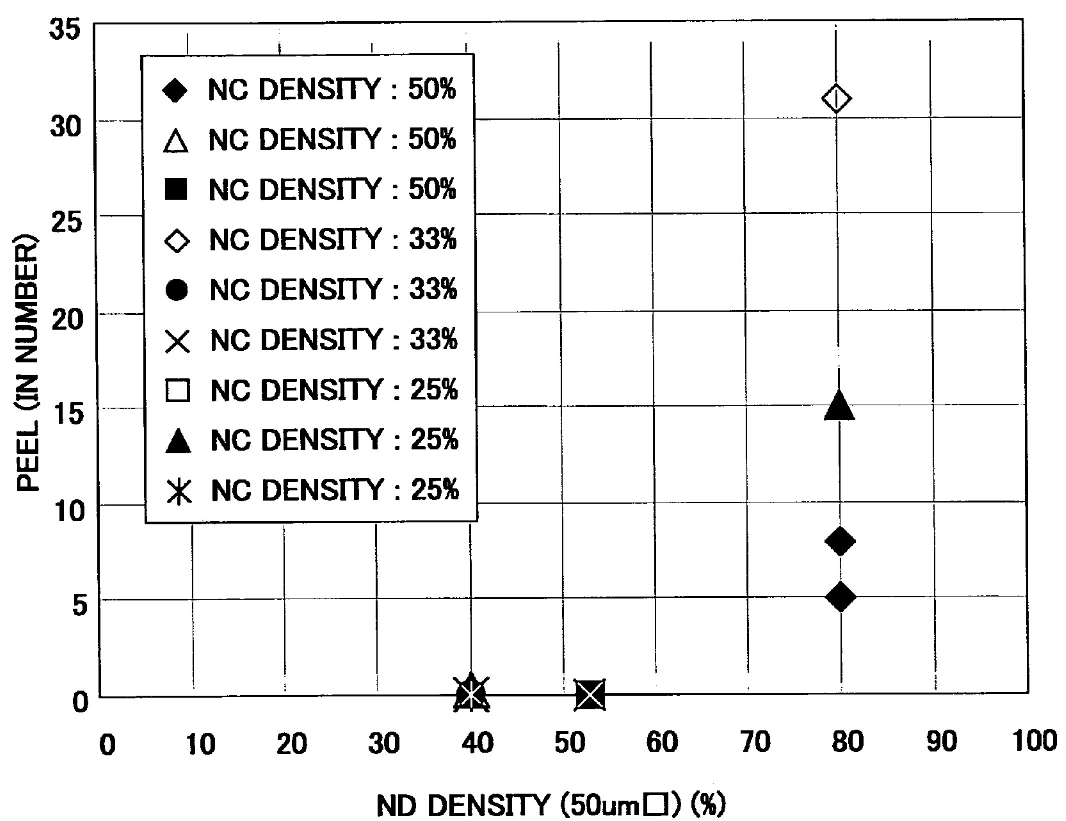
FIG. 10 is a diagram explaining the principle of the first embodiment of the present invention.

FIG. 10 shows the result of the search thus made, wherein it should be noted that FIG. 10 shows the number of occurrence of peeling at the time of formation of the via-holes $\mathbf{46}A_1$–$\mathbf{46}A_5$ that expose the Cu pattern 44H in the structure of FIG. 5 for various density values NC of the via-plugs 44P as a function of the density value ND of the via-plugs 46P.

In FIG. 10, it should be noted that the density values ND and NC of FIG. 10 are obtained for the case the region of X [μm]×X [μm] has the size of 50 μm×50 μm (50 μm square). Further, as set forth before, the via-plugs 46P and 44P have the square shape of 0.2 μm length for each edge and are disposed with the minimum interval of 0.18 μm in correspondence to the design rule of 0.4 μm.

Referring to FIG. 10, it can be seen that there occurs no peeling for any combination of NC and ND, provided that the value of ND is less than 80%, such as 70% or less. On the other hand, when the value of ND has reached 80%, it can be seen that there occurs the problem of peeling in any of the cases in which NC is 25%, 33% or 50%.

Figure 11:
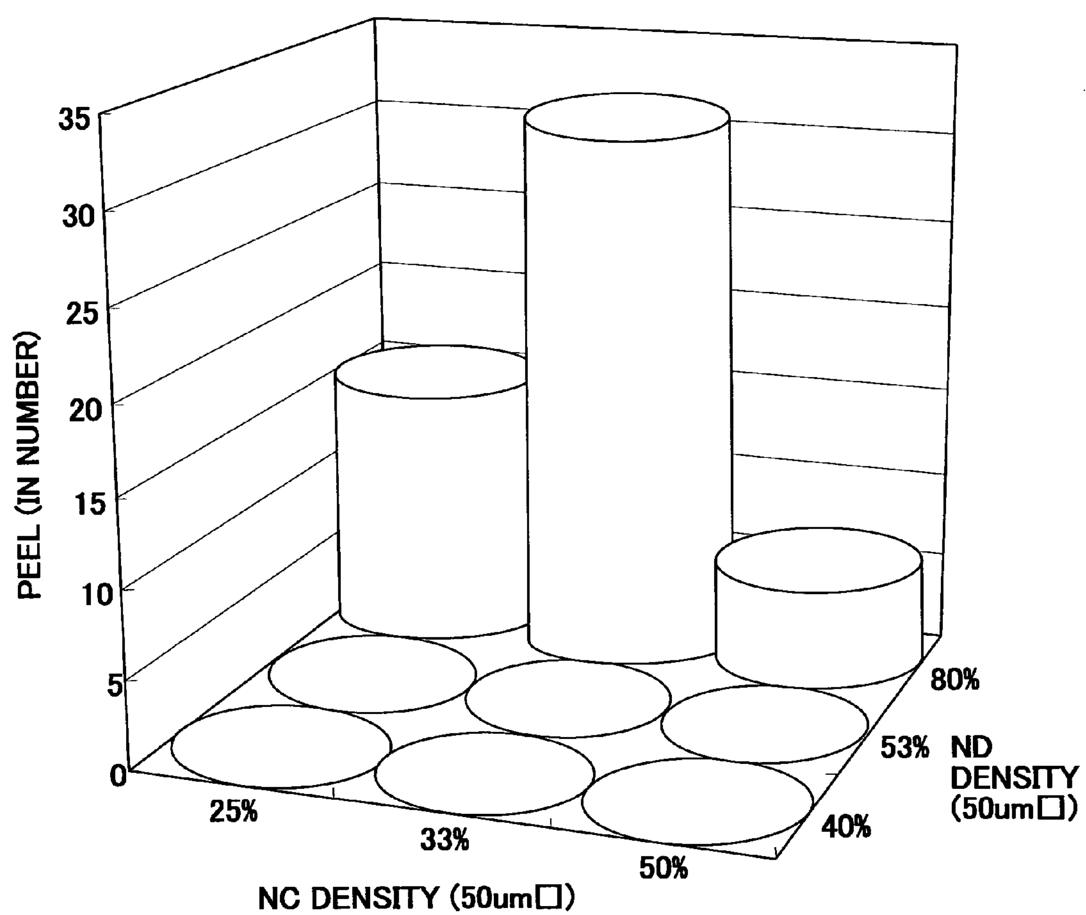
FIG. 11 is another diagram explaining the principle of the first embodiment of the present invention.

FIG. 11 is a diagram showing the observation of FIG. 10 in the form of a histogram in a plane defined by NC and ND.

Referring to FIG. 11, it can be seen that there occurs no peeling in the case ND is less than 80%, such as 70% or less.

From this, it can be seen that the problem of peeling of FIGS. 5 and 6 can be eliminated by imposing a design rule check (CRC) rejecting the layout that provides the density ND of the via-plugs 46 of larger than 70%, at the time of designing of the semiconductor device having the interconnection structure 100 of FIGS. 5 and 6.

On the other hand, in the calculation of the via-plug density according to Equation (1), there is a possibility that the foregoing value of 70% used as the reference value at the time of DRC, can change depending on the size of the X [μm]×X [μm] region. It should be noted that this region of X [μm]×X [μm] is used as the basis of the foregoing calculation of Equation (1). Thus, the inventor of the present invention has made an investigation about the effect of size of the foregoing region on the prediction of occurrence of the peeling, which is made based on the via-plug density, by observing actual occurrence of the peeling for the regions of various sizes.

Figure 12A:
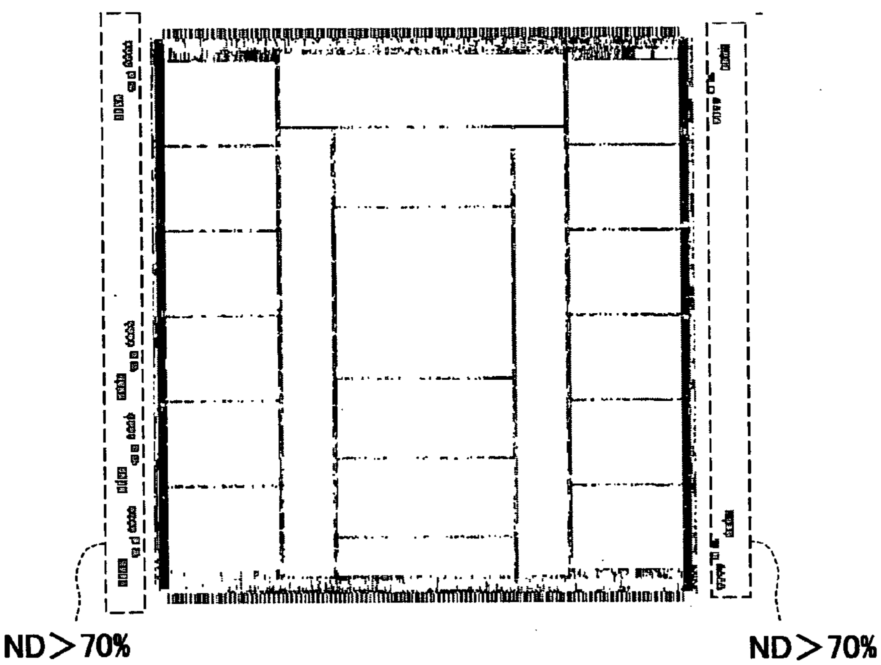
FIGS. 12A and 12B are further diagrams explaining the principle of the first embodiment of the present invention.

For example, in the case a search is made in a semiconductor integrated circuit for the regions (DRC regions) in which the density ND of the via-plugs 46P exceeds 70% while using the regions having the size of 50 μm for each edge for the CRC regions, a part of the semiconductor integrated circuit corresponding to the high-speed I/O region is detected as shown in FIG. 12A by a broken line as the part where the peeling occurs. In the region thus detected, there actually occurs the peeling of the s.

Figure 12B:
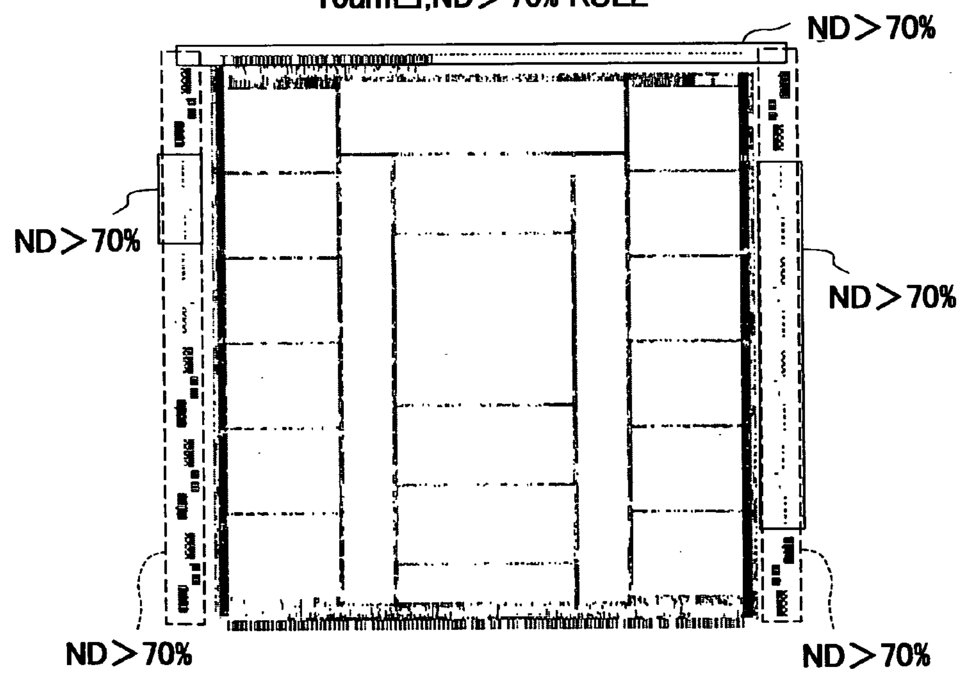

On the other hand, in the case a search for the region of the via-density ND of 70% or more has been made in the same semiconductor integrated circuit for the DRC regions having an edge length of 10 μm, a detection is made even when there exist only minute patterns, because of the small area of the CRC region used. Thus, as shown in FIG. 12B, the part shown by a continuous line is detected also as the region that causes the via-plug peeling, in addition to the part shown in FIG. 12A by the broken line. In FIG. 12B, it should be noted that the part shown by the continuous line does not actually cause the problem of peeling.

Figure 13A:
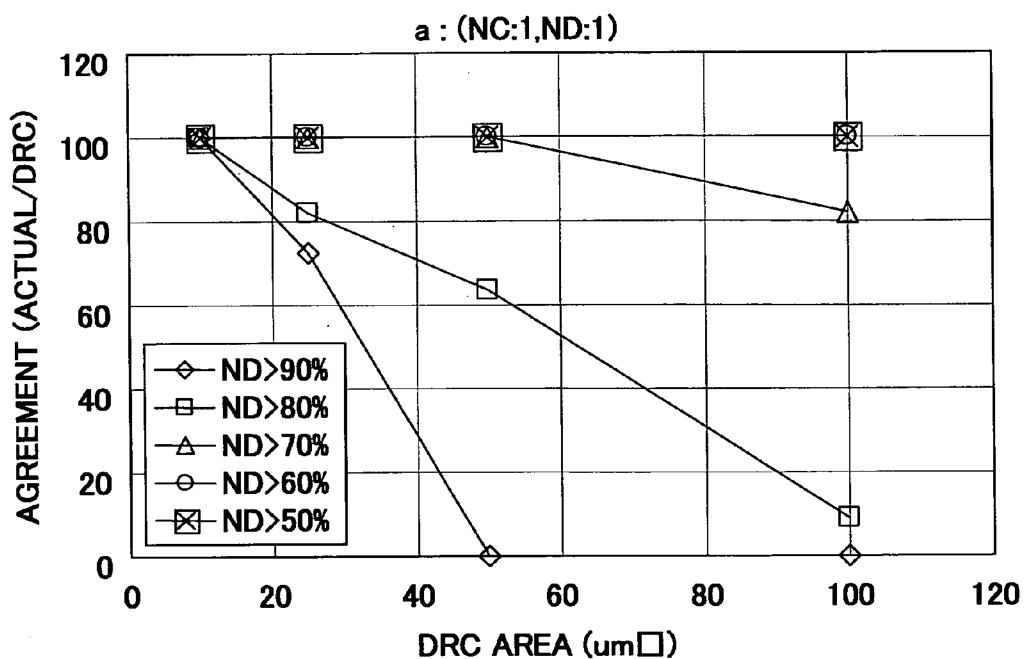
FIGS. 13A and 13B are further diagrams explaining the principle of the first embodiment of the present invention.
Figure 13B:
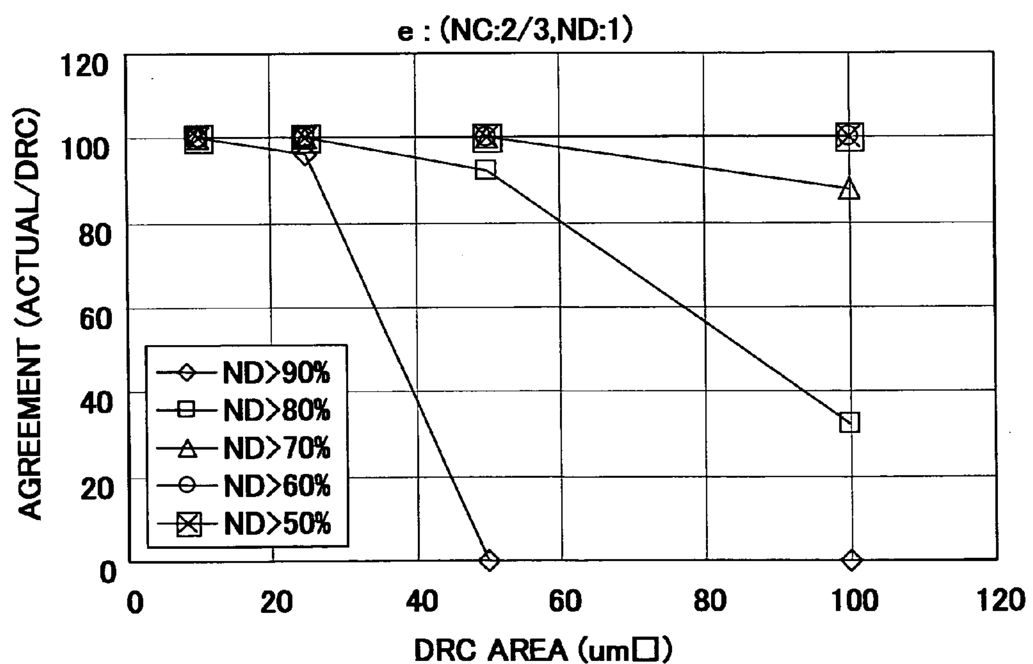

FIG. 13A shows the rate of agreement between the prediction of the peeling based on the DRC reference standard which relies on the ND value and the actual occurrence of the peeling, as a function of the area of the DRC region for the case the density NC of the via-plugs 44P and the density NP for the via-plugs 46P are 1:1. Further, FIG. 13B shows a similar relationship for the case of NC:ND=⅔:1. In FIGS. 13A and 13B, it should be noted that the regions providing the ND value of 50–90% are detected as the part that causes peeling for each of the cases in which the DRC region is defined to have the size of 100 μm square, 50 μm square, and 25 μm square, and comparison is made between the prediction and actual occurrence of the peeling.

Referring to FIGS. 13A and 13B, it can be seen that the occurrence of peeling is detected 100% by the DRC in any of the DRC reference standards of 50–90%, as long as the area of the DRC region is small. On the other hand, because of the too small area of the DRC regions, there can occur a false detection of peeling in the regions where there occurs no actual peeling.

On the other hand, when the area of the DRC region is increased too much, there can be caused an error in which the peeling is not detected by the DRC. Further, when the reference standard of ND>90% or ND>80% is used, the prediction by the DRC does not agree with the actual observation even in the case the DRC regions have a size of 20 μm for each edge. Thereby, there is a risk of error that occurrence of peeling is overlooked.

Thus, the present invention proposes, based on the results of FIGS. 10 and 11 explained before that the peeling occurs actually in the case ND is 80% or more, to set the size of the DRC region shown in FIG. 9 to 50–100 μm square, preferably to 50 μm square and to set the ND value to 70% for the DRC reference standard that can detect the site where the peeling occurs while minimizing the error.

Thus, in the present embodiment, actual occurrence of peeling in the semiconductor integrated circuit is avoided by rejecting the layout patterns that provide the density ND for the via-plugs 46 exceeding 70% when viewed in the DRC region having a size of 50 μm edge, as the layout pattern that can cause the problem of peeling.

Further, the present embodiment proposes to set the DRC reference standard for ND to 60%. In this case, it is possible to detect the site that causes peeling with 100% confidence even in the case the DRC area is set to 50–100 μm square.

Thus, in the present embodiment, the layout patterns that provide the via-plug density ND for the via-plugs 46P of larger than 60% in the DRC region having a size of 100 μm for each edge, are rejected as the layout pattern potentially causing the peeling at the time of designing of the semiconductor integrated circuit.

FIG. 14 shows the area (error area) for the regions where occurrence of peeling is predicted by DRC (DRC error) for various semiconductor integrated circuit products A–I for the case DRC is conducted for the DRC regions having a 50 μm size for each edge. Here, it should be noted that FIG. 14 shows the results for the interconnection structure in which the via-plugs 46P having a size of 0.22 μm for each edge are arranged with a pitch of 0.40 μm.

Here, it should be noted that there occurs no actual peeling in the products A and B, and thus, it is preferable that the DRC reference standard is set such that it does not detect a DRC error in these products and detects a DRC error in other products C–I in which there is caused actual peeling.

Referring to FIG. 14, it can be seen the product A includes no regions of ND>50%–ND>90% when analyzed with the DRC region having the size of 50 μm for each edge, and thus, there is caused no DRC detection. Further, the product B includes the region of ND>60%, but not the region of ND>70%. In this case, too, there is no detection of peeling.

On the other hand, the product C includes the region of ND>70% and detection of peeling is made in conformity with the actual observation.

From this, it is concluded that it is possible to avoid the occurrence of peeling at the via-plugs 44P in the interconnection structure including therein the via-plugs 46 formed with the interconnection pattern pitch of 0.4 μm, by rejecting the layout that provides ND>70%.

FIG. 15 shows the DRC error for the case the DRC is applied to the same products A–I while using the DRC region of 100 μm square. In this case, too, the products A and B are free from actual peeling.

Referring to FIG. 15, there exists no region of ND>50% in the products A and B, and no clear DRC can be found. On the other hand, because the area of the DRC region is increased over the case of FIG. 14, it is predicted that the value of the via-density usable for the DRC reference standard should be decreased as compared with the case of FIG. 15. Thus, it is thought that it would be possible to avoid the occurrence of peeling by imposing the standard of ND>60%. In the example of FIG. 15, detection of a DRC error is made in the product C, which includes actual peeling, with the reference standard of ND>60%.

Thus, in the case of using the DRC area of 50–100 μm square, it becomes possible to avoid the problem of peeling at the via-plugs 44P by applying the reference standard of ND>60% and thus rejecting the layout that provided the via-density exceeding 60% for the via-plugs 46P. Further, with regard to the ND/NC ratio that does not cause the peeling, it is preferable to set the N/NC ratio of be less than 1.6 in view of the result of FIG. 10 that the ND density should be less than 80% in the case the NC density is 50%.

It should be noted that while the foregoing explanation has been made with regard to the interconnection structure 100 of FIGS. 5 and 6 for the case of using an $SiO_2$ film for the interlayer insulation films **44*a*, 44*c*, 46*a* and 46*c* and an SOG film of the etching stopper films 44_b_ and 46, the present invention is effective also in the case the interlayer insulation films 44_a_, 44_c_, 46_a_ and 46_c_ are formed of an SiC film, SiOC film, an organosiloxane film including a HOSP (registered trade mark) film, a hydrogen silsesquioxane film, or a low-K dielectric organic interlayer insulation film including SiLK (registered trademark) or FLARE (registered trademark). Further, it is possible to use an SiN film for the etching stopper films 44_b_ and 44**_c_ in place of the SOG film. Further, it is also possible to use an SiC film or an SiOC film for this purpose.

Further, the present invention is applicable not only to the via-first process explained heretofore, but also to the via-after process, in which the via-holes are formed after formation of the interconnection grooves.

Figure 16:
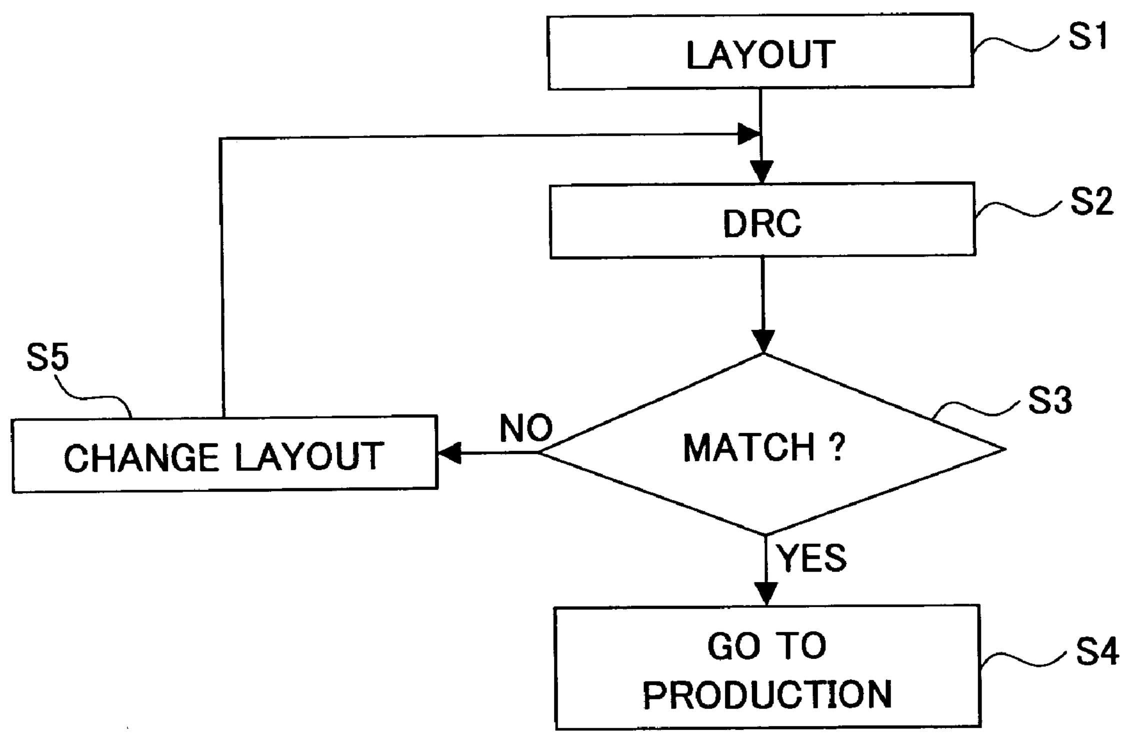
FIG. 16 is a flowchart showing designing process and fabrication process of the semiconductor device according to the first embodiment of the present invention.

FIG. 16 shows the fabrication process of a semiconductor device according to the first embodiment of the present invention that includes the DRC process.

Figure 1:
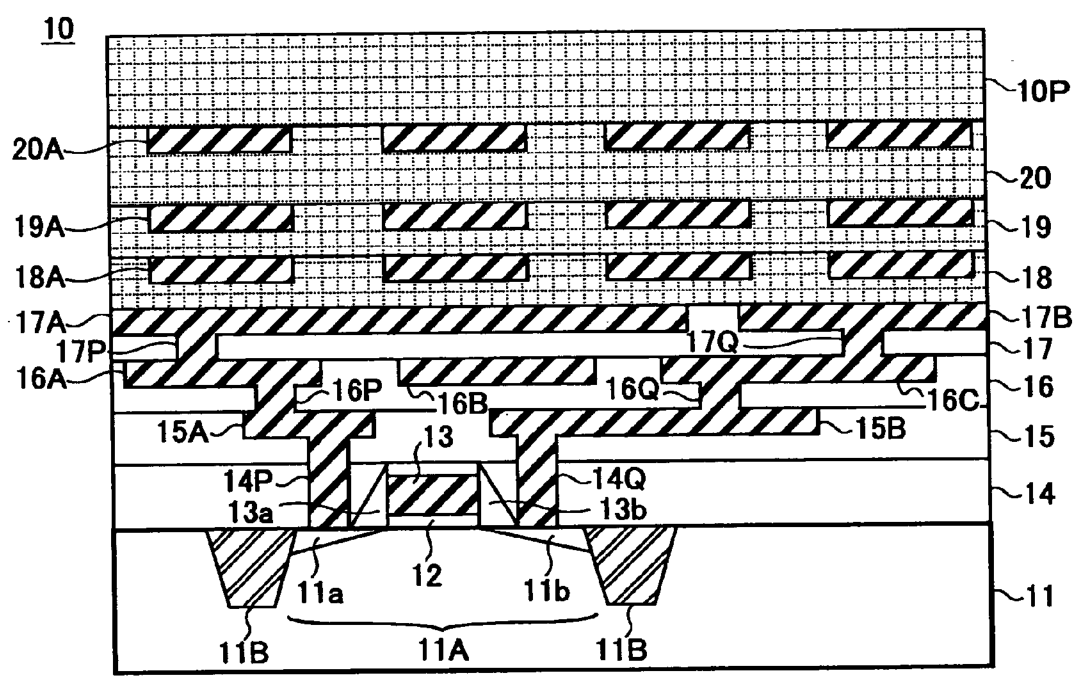
FIG. 1 is a cross-sectional diagram showing the construction of a semiconductor integrated circuit device according to a related art.
Figure 2A:
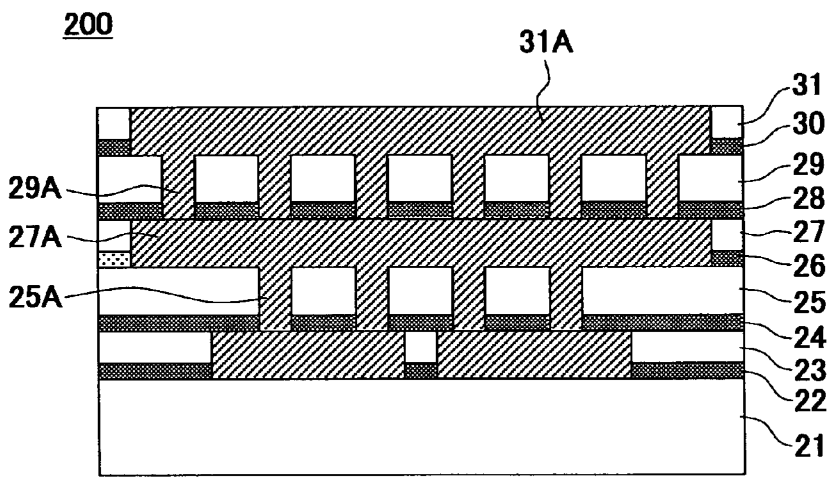
FIGS. 2A–2C are diagrams explaining the problems addressed by the present invention.
Figure 2B:
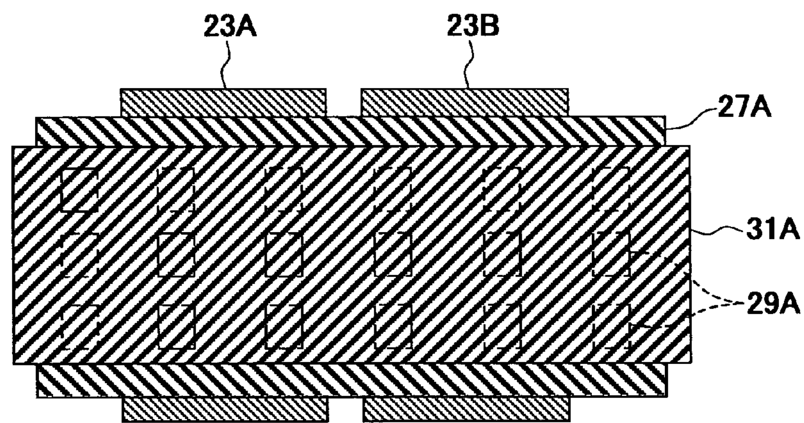
Figure 2C:
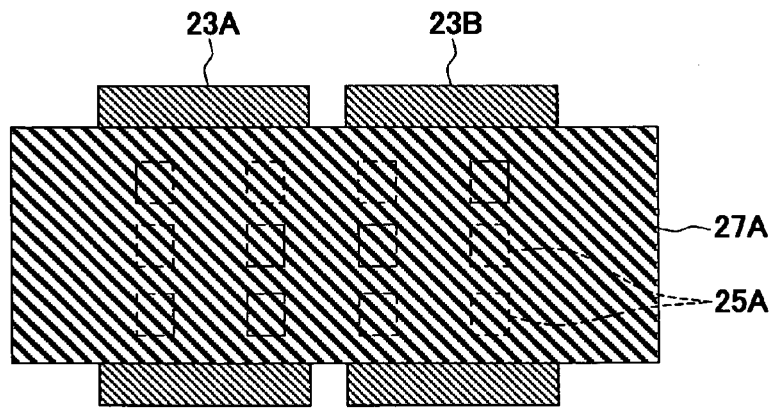

Referring to FIG. 16, there is formed a layout of a desired semiconductor device including a multilayer interconnection structure such as the one shown in FIG. 1 in the first step 1.

Next, in the step 2, a DRC is applied to the layout thus created, and examination is made in the step 3 whether or not the foregoing DRC is satisfied with the foregoing multilayer interconnection structure.

When the result of examination of the step 3 is YES, the process proceeds to the step 4 and fabrication of the semiconductor device is carried out whole using the layout. Thereby, the desired multilayer interconnection structure is formed by a dual damascene process.

When the result of examination of the step 3 is NO, on the other hand, the layout is modified in the step 5, and the DRC is applied again in the step S2. Thereby, the steps S2, S3 and S5 are repeated until the result of the step S3 becomes YES.

Second Embodiment

On the interconnection structure 100 of FIG. 6, there is formed a next multilayer interconnection with a less strict design rule and thus with larger interconnection pattern pitch.

Figure 17:
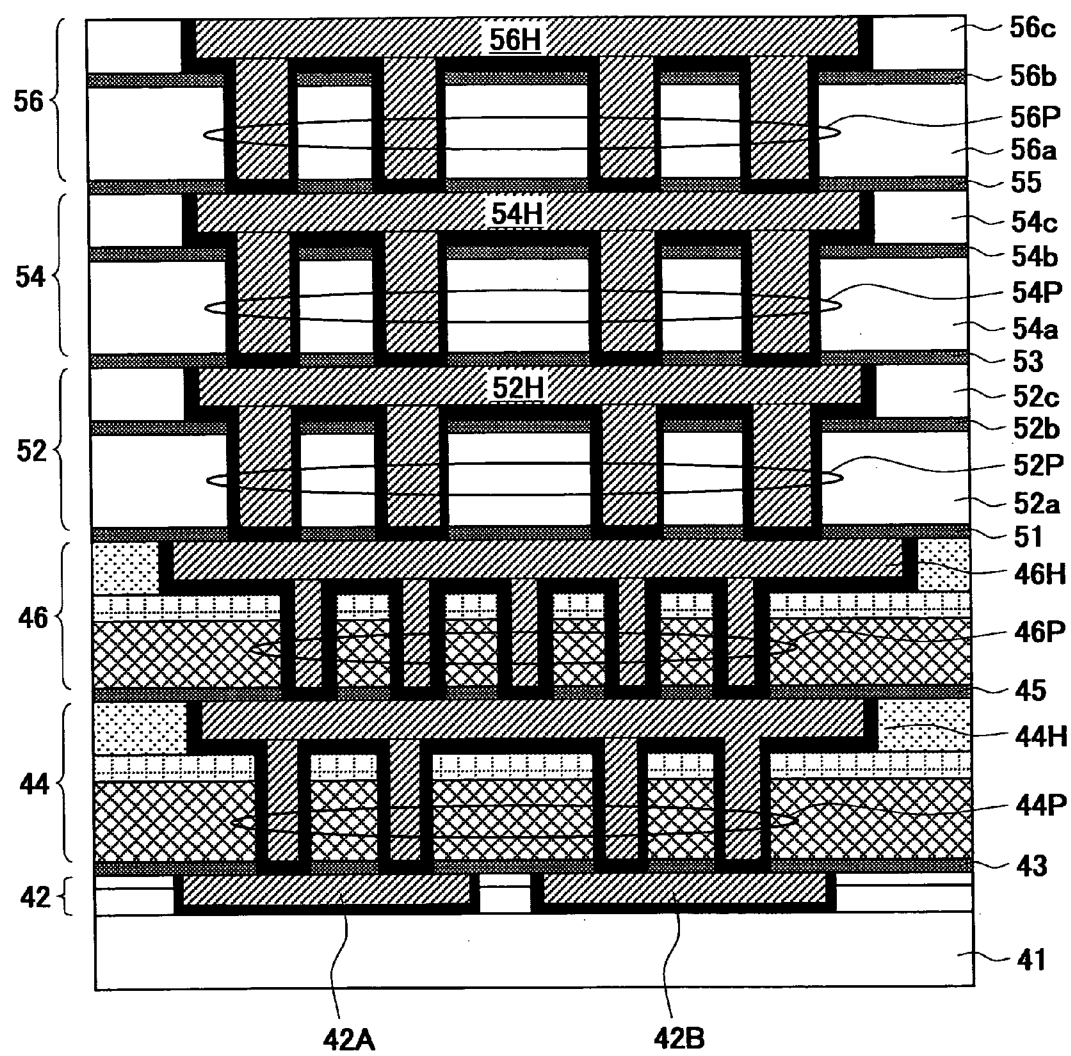
FIG. 17 is a diagram showing the construction of a semiconductor device according to a second embodiment of the present invention.

For example, an interlayer insulation film 52 including Cu via-plugs 52P and a Cu interconnection pattern 52H, an interlayer insulation film 54 including Cu via-plugs 54P and a Cu interconnection pattern 54H, and an interlayer insulation film 56 including Cu via-plugs 56P and a Cu interconnection pattern 56H are laminated on the interconnection structure 100 of FIG. 6 as shown in FIG. 17 via SiN films 53 and 55, wherein the Cu interconnection pattern 52H is connected to the Cu interconnection pattern 46H by the Cu via-plugs 52P and the Cu interconnection pattern 54H is connected to the Cu interconnection pattern 52H via the via-plugs 56H. Further, the Cu interconnection pattern 56H is connected to the Cu interconnection pattern 54H via the via-plugs 56P.

The interconnection patterns 52H-56H and the via-plugs 52P–56P in the interlayer insulation films 52–56 are formed with the dual damascene process, and thus, the interlayer insulation film 52 is formed of a lamination of an via-interlayer insulation film 52_a_ of $SiO_2$, an SiN etching stopper film 52_b_ and an $SiO_2$ interlayer insulation film 52_c_, while the interlayer insulation film 54 is formed of a lamination of a via-interlayer insulation film 54_a_ of $SiO_2$, an SiN etching stopper film 54_b_ and an $SiO_2$ interlayer insulation film 54_c_. Further, the interlayer insulation film 56 is formed of a lamination of the via interlayer insulation film 56_a_ of $SiO_2$, an SiN etching stopper film 56_b_ and an $SiO_2$ interlayer insulation film 56_c_.

In the example of FIG. 17, each of the via-plugs 52P–56P in the interlayer insulation films 52–56 are formed with the design rule of 0.6 μm, and thus, the via-plugs having a diameter of 0.3 μm are repeated with the pitch of 0.6 μm.

Now, designating the density of the via-plugs 52P as NE, the density of the via-plugs 54P as NF and the density of the via-plugs 56P as NG, the density ND of the via-plugs 46P becomes larger than the density NE in the example of FIG. 17, and there occurs no peeling at the interface between the via-plug 46P and the Cu interconnection pattern 44H.

It is true that a similar peeling can occur in the case of the interlayer insulation films 52–56 at the lower layer via-plugs in the case the via-plug density of the upper layer via-plugs is larger than the via-plug density of the lower layer via-plugs. On the other hand, because the via-diameters and the via-pitches are different in the interlayer insulation films 52–56 over the interlayer insulation films 42–46, the use of the DRC that uses the reference standard of 70% for the via-plug density in the DRC region of 50 μm square is deemed inappropriate. In such a case, it is thought more appropriate to use the reference standard value of 85%, which is obtained by multiplying a correction coefficient of 1.21 corresponding to the area ratio $(=(0.22\times0.22)/(0.4\times0.4)/(0.30\times0.30)/(0.6\times0.6))$ to the foregoing reference standard value. In the above derivation, it should be noted that the term $0.22\times0.22$ represents the area occupied by a single via-plug 46P, while the term $0.4\times0.4$ represents the area allocated to a single via-plug in the case of using the 0.4 μm design rule, including the non-occupied area. Similarly, the term $0.30\times0.30$ represents the area occupied by a single via-plug 52P (or any of 54P and 56P), while the term $0.6\times0.6$ represents the area allocated to the via-plug in the 0.6 μm design rule, including the non-occupied region.

FIG. 18 shows the result of the DRC as applied to the via-plugs 52P, 54P and 56P of FIG. 17 in the products A–I of FIGS. 14 and 15, wherein it should be noted that the DRC region is set to have the size of 50 μm square in FIG. 19.

Referring to FIG. 18, there occurs no actual peeling in the interlayer insulation films 52–56 in any of the products A–I, and thus, it can be seen that no peeling is detected in conformity with the actual device in the case the DRC reference standard of 80% is applied. In the case the DRC reference standard of 70% is applied, on the other hand, there can be cases in which occurrence of peeling is erroneously detected.

From the foregoing, it is possible to avoid the problem of peeling of the via-plugs in the interconnection structure in which the interconnection pattern pitch is 0.6 μm by rejecting the layout that provides the via-area rate exceeding 85%.

Third Embodiment

In the foregoing embodiment of FIG. 5, there has been caused the problem of peeling in the via-plugs 44P with the formation of the via-holes 46$A_1$–46$A_5$ as explained before, wherein there is a possibility that such a peeling of the via-plugs 44P originates from the defects that are introduced to the surface of the Cu interconnection patterns 42B at the time of formation of the via-holes 44A and 44B.

In the step of FIG. 4F, the SiN film 43 is removed at the bottom of the openings 44A and 44B at the time of formation of the interconnection grooves 44G, and thus, the surface of the Cu interconnection pattern 42B is exposed to the plasma and radicals accompanying the plasma during the process of patterning the SOG film 44_b_ while using the SiN film 45 remaining on the interlayer insulation film 44_c_ as a mask.

The existence of such defects at the surface of the Cu interconnection pattern 42B is also inferred from the fact that the problem of peeling can be avoided when the activation sputtering process, which is applied to the surface of the Cu interconnection pattern 42B after the step of FIG. 4F but before the step of FIG. 4G, with the depth of 15 nm, which is larger than the conventional depth of 7.5 nm. This sputtering process, however, works isotropically and thus not preferable as the means for eliminating the peeing, as there can be caused rounding of shoulders in the interlayer insulation film 44*c* when such deep sputtering process has been made, leading to the possibility of short circuit, and the like, at the time of formation of the Cu interconnection pattern.

On the other hand, the inventor of the present invention has discovered, in the third embodiment of the present invention, that the peeling can be avoided also by changing the condition of the dry etching in the steps of FIG. 4F and FIG. 4M.

More specifically, it has been practiced to carry out the dry etching process of the steps of FIGS. 4F and 4M by using a plasma etching apparatus of the parallel-plate type by inducing plasma by supplying a high frequency power of about 1000W to the upper electrode with the frequency of 60 Hz while applying a bias power of 2 MHz to the lower electrode holding the substrate to be processed.

On the other hand, it was discovered that the problem of peeling is avoided when the plasma density is reduced, by applying the high frequency power of 27 MHz and 2 MHz to the lower electrode in the steps of FIGS. 4F and 4M and exciting the plasma at the same time with the high-frequency power of 27 MHz.

Figure 19A:
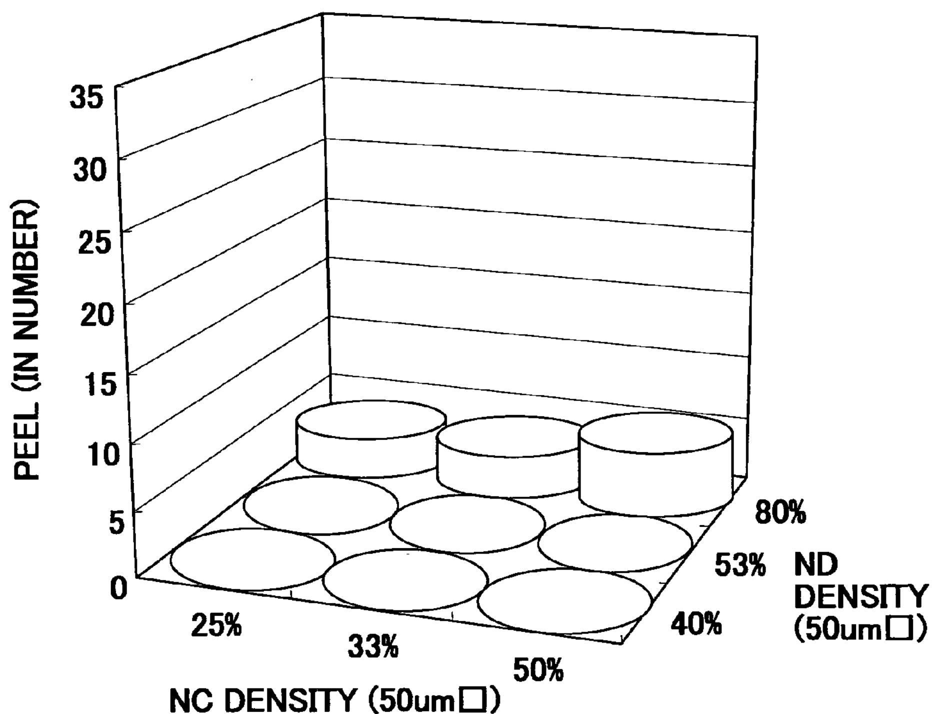
FIGS. 19A and 19B are diagrams explaining a third embodiment of the present invention.

FIG. 19A shows the occurrence of defects in the state of FIG. 4F for the case such a novel dry etching condition is used in the step of FIG. 4F for various combinations of the ND density and the NC density. Further, FIG. 19B shows the occurrence of the defects in the state in which the interconnection groove 44G and the via-plugs 44A are filled with Cu.

Figure 19B:
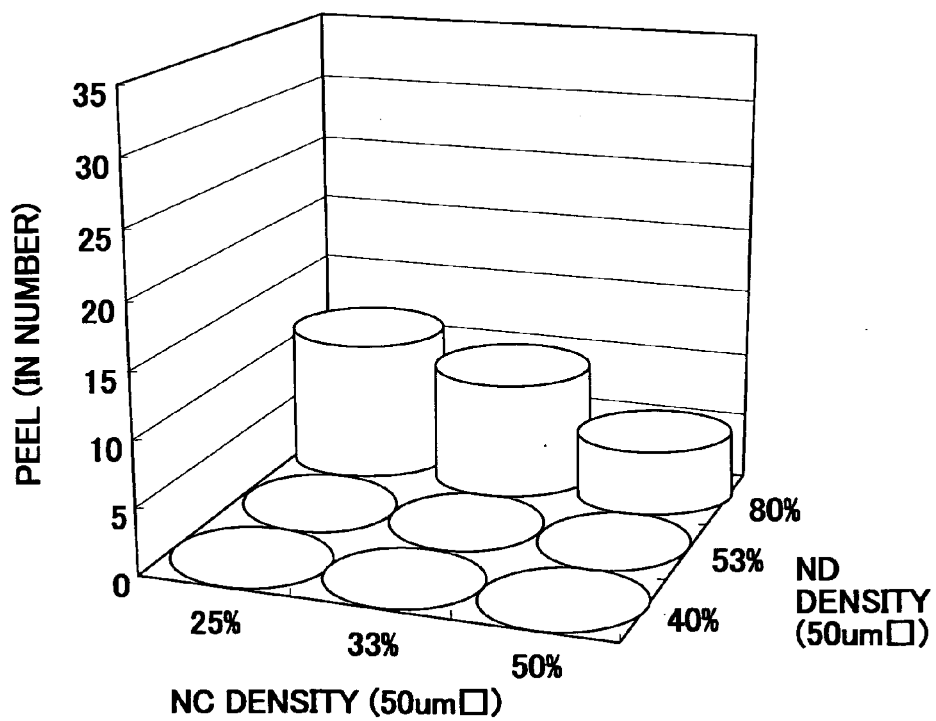

Referring to FIGS. 19A and 19B, it can be seen that the number of the defects is reduced significantly by reducing the plasma power at the time of the dry etching process.

On the other hand, in the case only the foregoing novel dry etching condition is applied to the step of FIG. 4F, the occurrence of the defects itself is not completely avoided, and the use of the DRC explained before that restricts the density of the via-plugs 44P to 70% or less in the DRC region of 50 μm for each edge is still effective for avoiding the occurrence of the peeling.

The foregoing results suggests that, in the dry etching process of FIG. 4F or FIG. 4M, some energy is injected to the upper via-holes formed with a larger density, and this energy is transferred to the lower via-holes formed with a smaller density. Thereby, there is caused a concentration of the energy in each of the lower s. However, detailed mechanism or model of this phenomenon is not understood at the present juncture.

Further, the present invention is not limited to the embodiments described heretofore, but various variations and modifications may be made without departing from the scope of the invention.

What is claimed is:

1. A semiconductor device, comprising:

a first interconnection layer comprising a first interlayer insulation film and a first interconnection pattern formed in said first interlayer insulation film so as to be exposed at a surface of said first interlayer insulation film, said first interlayer insulation film and said first interconnection pattern forming a common first planarized principal surface;

a second interconnection layer comprising a second interlayer insulation film formed on said first interlayer insulation film and a second interconnection pattern formed in said second interlayer insulation film so as to be exposed at a surface of said second interlayer insulation film, said second interlayer insulation film and said second interconnection pattern forming a common second planarized principal surface; and a third interconnection layer comprising a third interlayer insulation film formed on said second interlayer insulation film and a third interconnection pattern formed in said third interlayer insulation film so as to be exposed at a surface of said third interlayer insulation film, said third interlayer insulation film and said third interconnection pattern forming a common third planarized principal surface;

said second interconnection pattern being connected to said first interconnection pattern by a plurality of via-plugs extending through said second interlayer insulation film and forming a first via-plug group, said third interconnection pattern being connected to said second interconnection pattern by a plurality of via-plugs extending through said third interlayer insulation film and forming a second via-plug group, said first via-plug group including said plural via-plugs therein with a number such that a via-plug density defined as a ratio of a total area of said via-plugs forming said first via-plug group and included in a unit area to a total area of said via-plugs forming said first via-plug group and disposed in said unit area with a maximum possible number according a design rule, takes a first density value, said second via-plug group including said plural via-plugs therein with a number such that a via-plug density defined as a ratio of a total area of said via-plugs forming said second via-plug group and included in a unit area to a total area of said via-plugs forming said second via-plug group and disposed in said unit area with a maximum possible number according a design rule, takes a second density value, said first density value being smaller than said second density value, said design rule being set such that said via-plugs are disposed with a minimum pitch of 0.4 μm in any of said first and second via-plug groups, said second density value being 70% or less.

2. The semiconductor device as claimed in claim 1, wherein said unit area is an area having a size of 50 μm for each edge.

3. A semiconductor device, comprising:

a first interconnection layer comprising a first interlayer insulation film and a first interconnection pattern formed in said first interlayer insulation film so as to be exposed at a surface of said first interlayer insulation film, said first interlayer insulation film and said first interconnection pattern forming a common first planarized principal surface;

a second interconnection layer comprising a second interlayer insulation film formed on said first interlayer insulation film and a second interconnection pattern formed in said second interlayer insulation film so as to be exposed at a surface of said second interlayer insulation film, said second interlayer insulation film and said second interconnection pattern forming a common second planarized principal surface; and a third interconnection layer comprising a third interlayer insulation film formed on said second interlayer insulation film and a third interconnection pattern formed in said third interlayer insulation film so as to be exposed at a surface of said third interlayer insulation film, said third interlayer insulation film and said third interconnection pattern forming a common third planarized principal surface;

said second interconnection pattern being connected to said first interconnection pattern by a plurality of via-plugs extending through said second interlayer insulation film and forming a first via-plug group, said third interconnection pattern being connected to said second interconnection pattern by a plurality of via-plugs extending through said third interlayer insulation film and forming a second via-plug group, said first via-plug group including said plural via-plugs therein with a number such that a via-plug density defined as a ratio of a total area of said via-plugs forming said first via-plug group and included in a unit area to a total area of said via-plugs forming said first via-plug group and disposed in said unit area with a maximum possible number according a design rule, takes a first density value, said second via-plug group including said plural via-plugs therein with a number such that a via-plug density defined as a ratio of a total area of said via-plugs forming said second via-plug group and included in a unit area to a total area of said via-plugs forming said second via-plug group and disposed in said unit area with a maximum possible number according a design rule, takes a second density value, said first density value being smaller than said second density value, said design rule being set such that said via-plugs are disposed with a minimum pitch of 0.4 μm in any of said first and second via-plug groups, said second density value being 60% or less in the case said unit area has a size of 50–100 μm for each edge.

4. The semiconductor device as claimed in claim 1, wherein said first interconnection pattern, said second interconnection pattern, said third interconnection pattern, said via-plugs forming said first via-plug group and said via-plugs forming said second via-plug group are formed of Cu.

5. The semiconductor device as claimed in claim 1, wherein said second density value is less than 1.6 times said first density value.

6. The semiconductor device as claimed in claim 1, wherein said via-plugs forming said first via-plug group and said via-plugs forming said second-via-plug group are formed respectively in a first region of said second interlayer insulation film and a second region of said third interlayer insulation film, and wherein said first and second regions overlap each other when viewed in a direction perpendicular to said third interlayer insulation film.

7. A semiconductor device, comprising:

a first interconnection layer comprising a first interlayer insulation film and a first interconnection pattern formed in said first interlayer insulation film so as to be exposed at a surface of said first interlayer insulation film, said first interlayer insulation film and said first interconnection pattern forming a common first planarized principal surface;

a second interconnection layer comprising a second interlayer insulation film formed on said first interlayer insulation film and a second interconnection pattern formed in said second interlayer insulation film so as to be exposed at a surface of said second interlayer insulation film, said second interlayer insulation film and said second interconnection pattern forming a common second planarized principal surface; and a third interconnection layer comprising a third interlayer insulation film formed on said second interlayer insulation film and a third interconnection pattern formed in said third interlayer insulation film so as to be exposed at a surface of said third interlayer insulation film, said third interlayer insulation film and said third interconnection pattern forming a common third planarized principal surface;

said second interconnection pattern being connected to said first interconnection pattern by a plurality of via-plugs extending through said second interlayer insulation film and forming a first via-plug group, said third interconnection pattern being connected to said second interconnection pattern by a plurality of via-plugs extending through said third interlayer insulation film and forming a second via-plug group, said first via-plug group including said plural via-plugs therein with a number such that a via-plug density defined as a ratio of a total area of said via-plugs forming said first via-plug group and included in a unit area to a total area of said via-plugs forming said first via-plug group and disposed in said unit area with a maximum possible number according a design rule, takes a first density value, said second via-plug group including said plural via-plugs therein with a number such that a via-plug density defined as a ratio of a total area of said via-plugs forming said second via-plug group and included in a unit area to a total area of said via-plugs forming said second via-plug group and disposed in said unit area with a maximum possible number according a design rule, takes a second density value, said first density value being smaller than said second density value, said design rule being set such that said via-plugs are disposed with a minimum pitch of 0.6 μm in any of said first and second via-plug groups, said second density value being 85% or less.

8. The semiconductor device as claimed in claim 7, wherein said unit area is a region having a size of 50 μm for each edge.

* * * * *